United States Patent
Hsu et al.

(10) Patent No.: US 9,997,660 B2
(45) Date of Patent: Jun. 12, 2018

(54) LIGHT BLOCKING SHEET, IMAGING LENS MODULE AND ELECTRONIC APPARATUS

(71) Applicant: LARGAN PRECISION CO., LTD., Taichung (TW)

(72) Inventors: Chih-Wen Hsu, Taichung (TW); Chih-Wei Cheng, Taichung (TW); Ming-Ta Chou, Taichung (TW)

(73) Assignee: LARGAN PRECISION CO., LTD., Taichung (TW)

( * ) Notice: Subject to any disclaimer, the term of this patent is extended or adjusted under 35 U.S.C. 154(b) by 0 days. days.

(21) Appl. No.: 15/434,163

(22) Filed: Feb. 16, 2017

(65) Prior Publication Data

US 2018/0138351 A1    May 17, 2018

(30) Foreign Application Priority Data

Nov. 14, 2016  (TW) .............................. 105137120 A

(51) Int. Cl.
| | |
|---|---|
| *H01L 27/146* | (2006.01) |
| *H01L 31/16* | (2006.01) |
| *H01L 33/58* | (2010.01) |
| *H01L 33/44* | (2010.01) |

(52) U.S. Cl.
CPC .............. *H01L 31/16* (2013.01); *H01L 33/44* (2013.01); *H01L 33/58* (2013.01)

(58) Field of Classification Search
CPC .......... H01L 31/16; H01L 33/44; H01L 33/58
See application file for complete search history.

(56) References Cited

U.S. PATENT DOCUMENTS

| | | | |
|---|---|---|---|
| 7,457,052 B2 | 11/2008 | Hirata | |
| 8,496,338 B2 | 7/2013 | Ho et al. | |
| 8,498,068 B2 | 7/2013 | Yu et al. | |
| 8,503,114 B2 | 8/2013 | Lai et al. | |
| 2015/0022896 A1* | 1/2015 | Cho | ................... G02B 13/0035 |
| | | | 359/601 |
| 2015/0198779 A1 | 7/2015 | Cho et al. | |
| 2016/0349504 A1* | 12/2016 | Kim | ................... G02B 27/0018 |

* cited by examiner

*Primary Examiner* — Su C Kim
(74) *Attorney, Agent, or Firm* — McClure, Qualey & Rodack, LLP

(57) ABSTRACT

A light blocking sheet includes a first outer layer, a second outer layer, an inner substrate layer and a central axis. The first outer layer includes a first opening. The second outer layer includes a second opening. The inner substrate layer is disposed between the first outer layer and the second outer layer. The inner substrate layer connects the first outer layer to the second outer layer, and the inner substrate layer includes a substrate opening. The central axis is coaxial with the first opening, the second opening and the substrate opening.

22 Claims, 25 Drawing Sheets

LIGHT BLOCKING SHEET, IMAGING LENS MODULE AND ELECTRONIC APPARATUS

RELATED APPLICATIONS

This application claims priority to Taiwan Application Serial Number 105137120, filed Nov. 14, 2016, which is herein incorporated by reference.

BACKGROUND

Technical Field

The present disclosure relates to a light blocking sheet and an imaging lens module. More particularly, the present disclosure relates to a light blocking sheet and an imaging lens module applicable to a portable electronic apparatus.

Description of Related Art

With the popularity of personal electronic products and mobile communication products having camera functionalities, such as smart phones and tablet personal computers, compact imaging lens modules are in popular. The demand for compact imaging lens modules with high resolution and high image quality has also been increasing significantly.

A light blocking sheet is used to block unnecessary lights in the imaging lens module. The surface properties of the light blocking sheet are critical to the effect of suppressing stray lights. Accordingly, the surface properties of the light blocking sheet affect the image quality of the imaging lens module.

A conventional light blocking sheet is usually made of a composite material. The composite material has a substrate layer made of a plastic material, such as a polyethylene terephthalate (PET), sandwiched by two outer layers made of a carbon-containing material. The conventional composite material is widely used to enhance the material strength. The composite material with the outer layers made of the carbon-containing material can further absorb lights due to its black surfaces. The composite material can be in the form of a material band due to the manufacturing method, which has the advantage of a thin thickness. Moreover, it allows the composite material to have a uniform thickness by controlling the manufacturing process of the substrate layer. It is also favorable to prevent the composite material from warping and to obtain a flat composite material being a thin film. Furthermore, the conventional light blocking sheet usually has an inner hole formed by stamping. However, when the inner hole is formed by stamping, the surface of the inner hole is smooth and bright and has a high reflectivity. Accordingly, the stray lights cannot be eliminated effectively, and the demand for high image quality cannot be satisfied.

A structure of the conventional light blocking sheet can refer to FIG. 1A and FIG. 1B. FIG. 1A is a front schematic view of a conventional light blocking sheet 1. FIG. 1B is a partially cross-sectional view taken along line 1b-1b of the light blocking sheet 1 in FIG. 1A. As shown in FIG. 1A and FIG. 1B, the light blocking sheet 1 is annular and has a three-layer structure. The three layers are an outer layer L1, a substrate layer L3 and an outer layer L2, respectively. Each of the outer layer L1, the substrate layer L3 and the outer layer L2 has a circular inner hole (the reference numerals are omitted). A diameter of the circular inner hole of the outer layer L1, a diameter of the circular inner hole of the substrate layer L3 and a diameter of the circular inner hole of the outer layer L2 are identical. In other words, a surface facing the circular inner hole of the outer layer L1, a surface facing the circular inner hole of the substrate layer L3 and a surface facing the circular inner hole of the outer layer L2 are aligned with one another (the surfaces are called inner surfaces hereinafter, and the reference numerals of the inner surfaces are omitted). When an incident light M1 and an incident light M'1 strike one of the inner surfaces, a reflected light R1 and a reflected light R'1 are generated. When the light blocking sheet 1 is applied to an imaging lens module, the reflected light R1 and the reflected light R'1 will enter into the imaging lens module and interfere with the image. As a result, the conventional light blocking sheet 1 cannot eliminate stray lights effectively.

To sum up, how to improve the ability for eliminating stray lights of the light blocking sheet so as to enhance the image quality of the compact imaging lens module has become one of the most important issues nowadays.

SUMMARY

According to one aspect of the present disclosure, a light blocking sheet includes a first outer layer, a second outer layer, an inner substrate layer and a central axis. The first outer layer includes a first opening. The second outer layer includes a second opening. The inner substrate layer is disposed between the first outer layer and the second outer layer. The inner substrate layer connects the first outer layer to the second outer layer, and the inner substrate layer includes a substrate opening. The central axis is coaxial with the first opening, the second opening and the substrate opening. When a minimum diameter of the substrate opening is $\phi smin$, a diameter of the first opening is $\phi 1$, and a diameter of the second opening is $\phi 2$, the following conditions are satisfied:

$$\phi smin > \phi 1; \text{ and}$$

$$\phi smin > \phi 2.$$

According to another aspect of the present disclosure, an imaging lens module includes a barrel, an optical lens assembly and the light blocking sheet according to the aforementioned aspect. The optical lens assembly is disposed in the barrel. The light blocking sheet is disposed in the barrel.

According to yet another aspect of the present disclosure, an electronic apparatus includes the imaging lens module according to the aforementioned aspect and an image sensor. The image sensor is disposed on an image surface of the imaging lens module.

According to further another aspect of the present disclosure, a light blocking sheet includes a first outer layer, a second outer layer, an inner substrate layer, an air layer and a central axis. The first outer layer includes a first opening. The second outer layer includes a second opening. The inner substrate layer is disposed between the first outer layer and the second outer layer. The inner substrate layer connects the first outer layer to the second outer layer, and the inner substrate layer includes a substrate opening. The air layer is located between the first outer layer and the second outer layer, and the air layer is close to the first opening and the second opening. The central axis is coaxial with the first opening, the second opening and the substrate opening. When a length parallel to the central axis of the air layer is d, the following condition is satisfied:

$$5 \ \mu m < d < 50 \ \mu m.$$

According to further another aspect of the present disclosure, an imaging lens module includes a barrel, an optical lens assembly and the light blocking sheet according to the aforementioned aspect. The optical lens assembly is disposed in the barrel. The light blocking sheet is disposed in the barrel.

According to further another aspect of the present disclosure, an electronic apparatus includes the imaging lens module according to the aforementioned aspect and an image sensor. The image sensor is disposed on an image surface of the imaging lens module.

BRIEF DESCRIPTION OF THE DRAWINGS

The present disclosure can be more fully understood by reading the following detailed description of the embodiments, with reference made to the accompanying drawings as follows.

DETAILED DESCRIPTION

Light Blocking Sheet

Figure 1A:
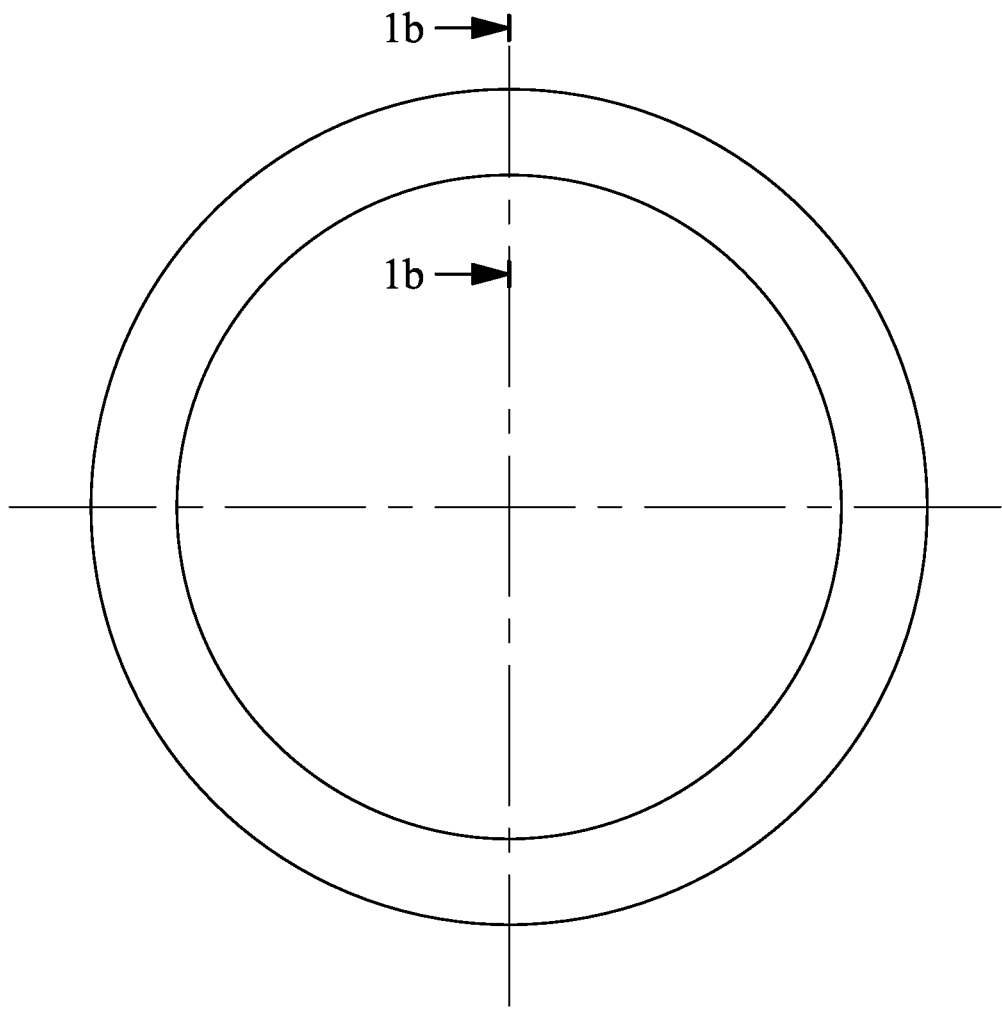
FIG. 1A is a front schematic view of a conventional light blocking sheet.
Figure 1B:
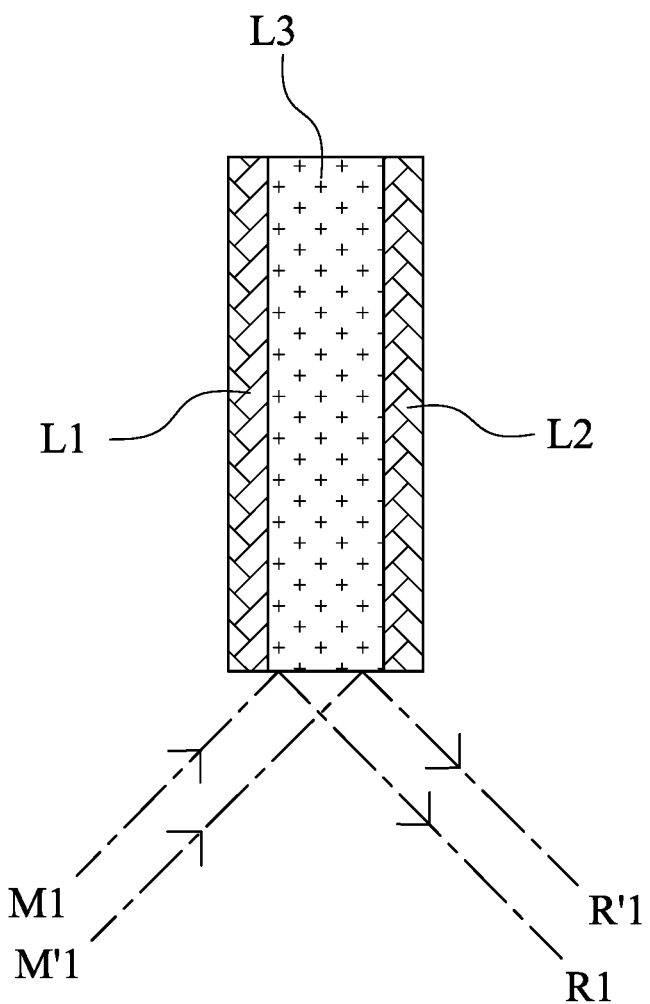
FIG. 1B is a partially cross-sectional view taken along line 1b-1b of the light blocking sheet in FIG. 1A.
Figure 2A:
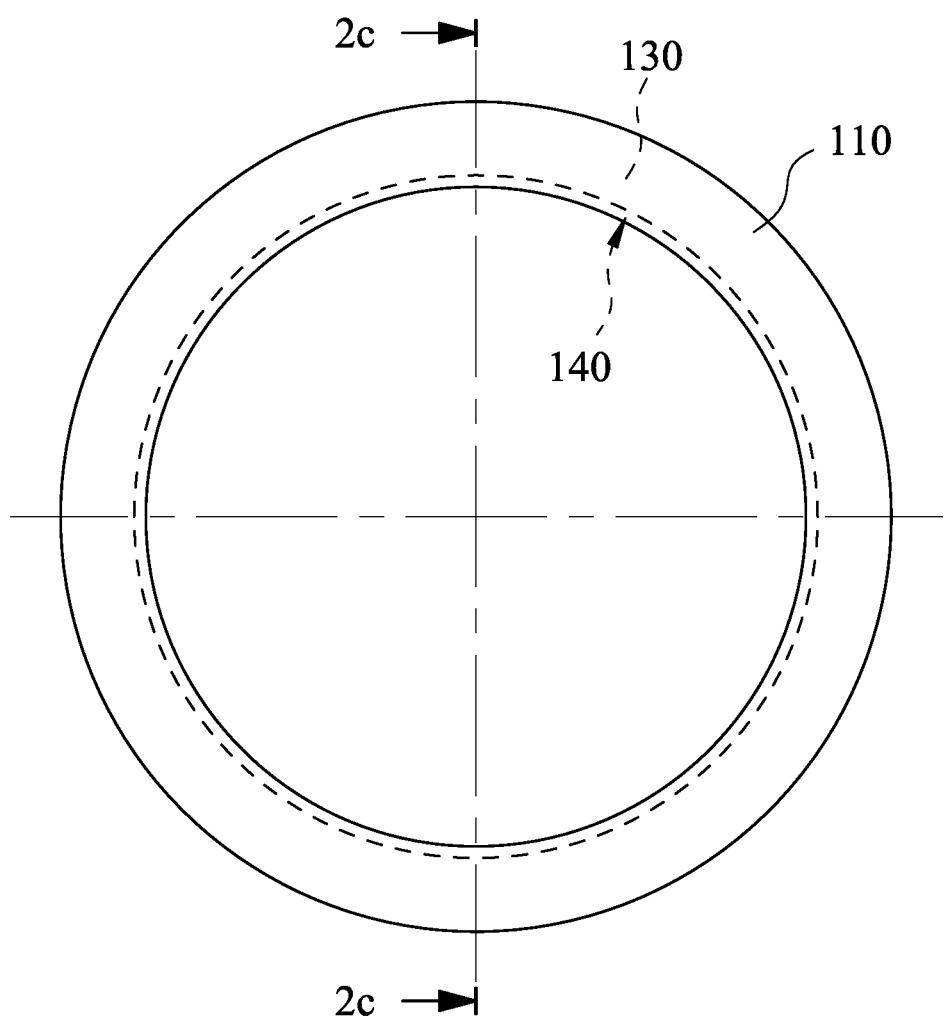
FIG. 2A is a front schematic view of a light blocking sheet according to one embodiment of the present disclosure.
Figure 2B:
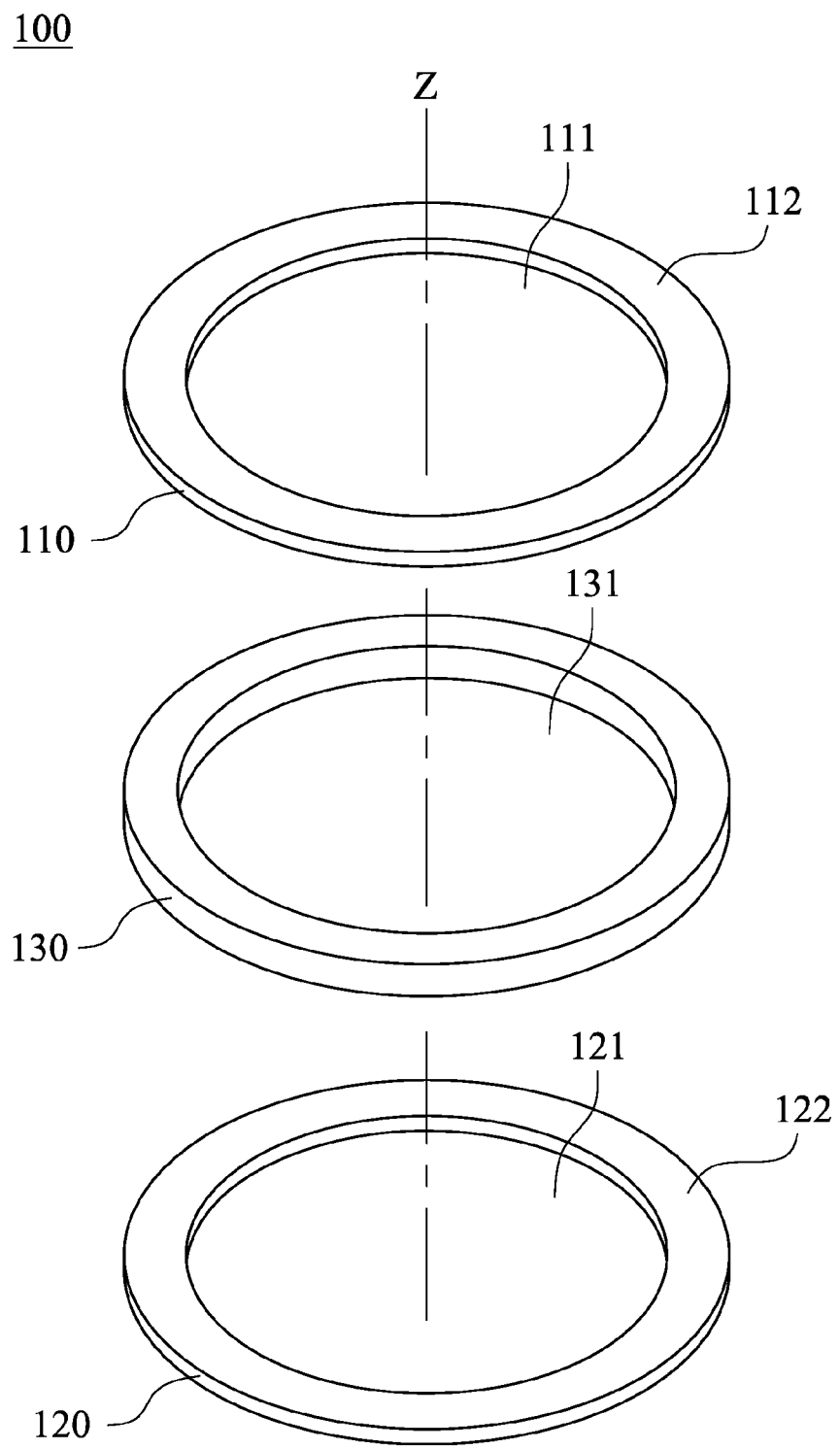
FIG. 2B is a separation schematic view showing layers of the light blocking sheet in FIG. 2A.
Figure 2C:
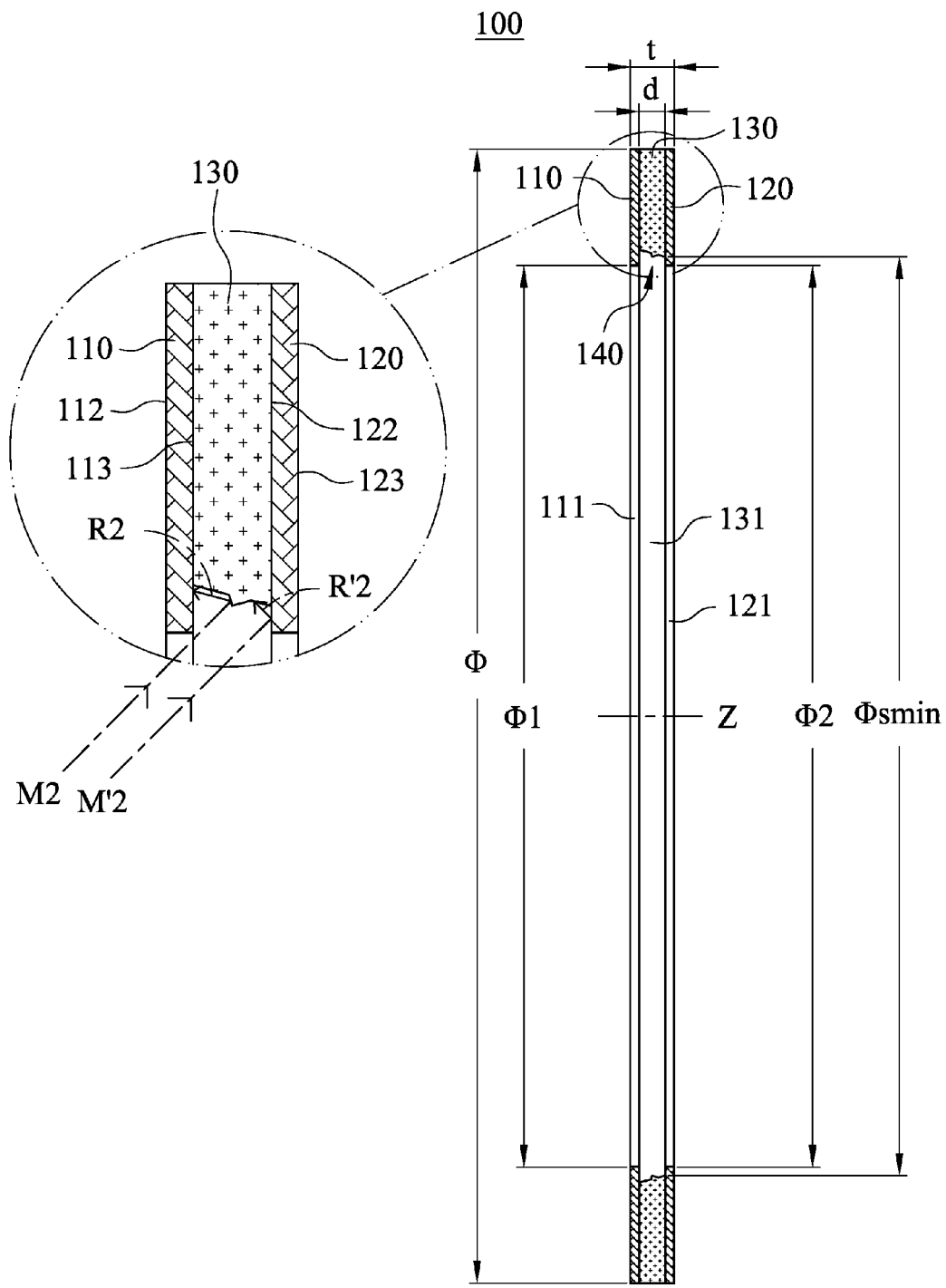
FIG. 2C is a cross-sectional view taken along line 2c-2c of the light blocking sheet in FIG. 2A.

FIG. 2A is a front schematic view of a light blocking sheet 100 according to one embodiment of the present disclosure. FIG. 2B is a separation schematic view showing layers of the light blocking sheet 100 in FIG. 2A. FIG. 2C is a cross-sectional view taken along line 2c-2c of the light blocking sheet 100 in FIG. 2A. In FIGS. 2A-2C, the light blocking sheet 100 includes a first outer layer 110, a second outer layer 120, an inner substrate layer 130 and a central axis Z.

Figure 2D:
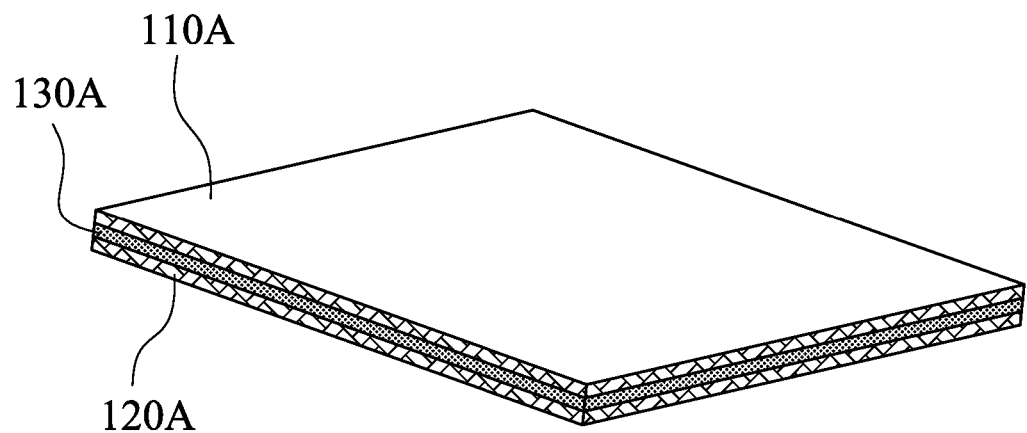
FIG. 2D is a schematic view of a composite material used to manufacture the light blocking sheet in FIG. 2A.
Figure 2E:
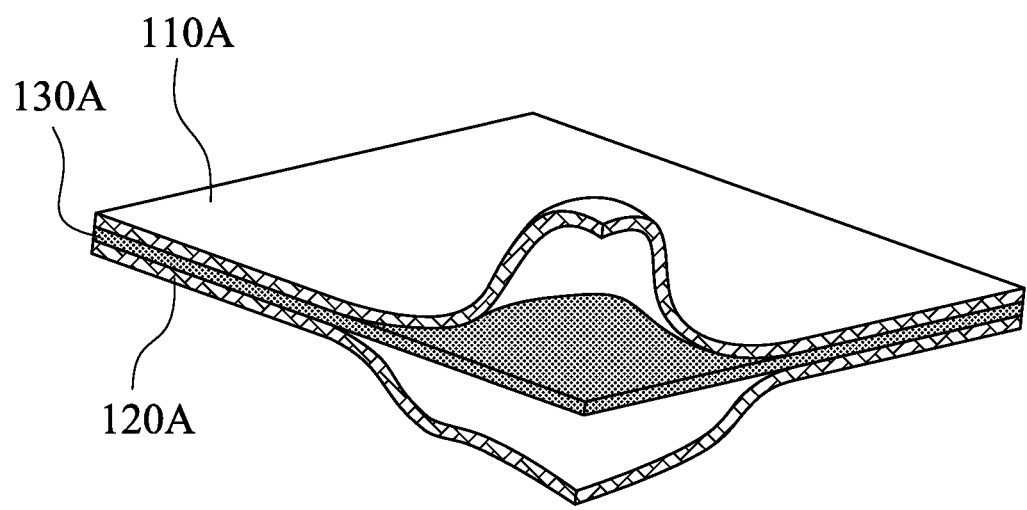
FIG. 2E is a partially separation schematic view of the composite material in FIG. 2D.

FIG. 2D is a schematic view of a composite material used to manufacture the light blocking sheet 100 in FIG. 2A. FIG. 2E is a partially separation schematic view of the composite material in FIG. 2D. In FIGS. 2D-2E, the composite material includes a first outer layer material 110A, a second outer layer material 120A and an inner substrate layer material 130A. In FIG. 2E, the first outer layer material 110A and the second outer layer material 120A are torn by an external force and are distorted due to a non-uniform extension, which intends to clearly show the first outer layer material 110A, the second outer layer material 120A and the inner substrate layer material 130A. However, under normal circumstance, the first outer layer material 110A is tightly connected with the second outer layer material 120A via the inner substrate layer material 130A as shown in FIG. 2D. Thus, the composite material can be a material band due to the manufacturing method, which allows the composite material to have a uniform thickness by controlling the manufacturing process of the inner substrate layer 130. Moreover, it is favorable to prevent the composite material from warping and to obtain a flat composite material being a thin film, which is favorable to maintain a thin thickness of the light blocking sheet 100.

Referring back to FIGS. 2A-2C, the first outer layer 110 includes a first opening 111, and the second outer layer 120 includes a second opening 121. The inner substrate layer 130 disposed between the first outer layer 110 and the second outer layer 120 connects the first outer layer 110 to the second outer layer 120, and the inner substrate layer 130 includes a substrate opening 131. The central axis Z is coaxial with the first opening 111, the second opening 121 and the substrate opening 131.

Specifically, the first outer layer 110 includes a first surface 112 facing outward and a second surface 113 facing inward. The second outer layer 120 includes a first surface 122 facing inward and a second surface 123 facing outward. The first outer layer 110 is connected with the inner substrate layer 130 via the second surface 113, and the second outer layer 120 is connected with the inner substrate layer 130 via the first surface 122. Moreover, the first opening 111, the second opening 121 and the substrate opening 131 are correspondent with one another.

When a minimum diameter of the substrate opening 131 is ϕsmin, a diameter of the first opening 111 is ϕ1, and a diameter of the second opening 121 is ϕ2, the following conditions are satisfied: ϕsmin>ϕ1; and ϕsmin>ϕ2. Therefore, an inner space (shown in FIG. 2C) is defined by the first outer layer 110, the second outer layer 120 and the inner substrate layer 130, and the inner space is communicated with the substrate opening 131. When no other materials are disposed in the inner space, the inner space is an air layer 140. In other words, the air layer 140 is located between the first outer layer 110 and the second outer layer 120. The air layer 140 is close to the first opening 111 and the second opening 121, and is communicated with the substrate opening 131. The description "the air layer 140 is close to the first opening 111 and the second opening 121" refers that the air layer 140 is closer to the first opening 111 and the second opening 121 than the inner substrate layer 130.

As shown in FIG. 2C, when an incident light M2 and an incident light M'2 strike a surface of the inner space (air layer 140), i.e. the surface of the inner substrate layer 130 facing the substrate opening 131, the second surface 113 of the first outer layer 110 or the first surface 122 of the second outer layer 120, a reflected light R2 and a reflected light R'2 generated thereby tend to reflect again in the inner space (air layer 140). Accordingly, the light blocking sheet 100 can effectively attenuate an intensity of the light reflected therefrom. When the light blocking sheet 100 is applied to an imaging lens module, the stray lights can be effectively reduced, and the image quality can be enhanced.

In the embodiment, the inner space is the air layer 140, so that the reflection of the stray lights can be reduced. In other embodiments, a material which can absorb lights or can reduce the reflected lights, such as a black powder or a black glue of a carbon-containing material or an anti-reflective coating material, can be disposed in the inner space. The anti-reflective coating material can include $TiO_2$ and $SiO_2$. Preferably, the material disposed in the inner space does not protrude from the inner space. Moreover, as shown in FIG. 2C, the surface of the inner substrate layer 130 facing the substrate opening 131 can be a rugged surface which is inclined with respect to the central axis Z, so that the intensity of the light reflected from the air layer 140 can be further attenuated. In other embodiments, the surface of the inner substrate layer 130 facing the substrate opening 131 can be a smooth surface which is inclined with respect to the central axis Z and is curve (such as that shown in FIG. 5 and FIG. 6). Alternatively, the surface of the inner substrate layer 130 facing the substrate opening 131 can be a concave surface (such as that shown in FIG. 7) or a convex surface (such as that shown in FIG. 8).

The inner substrate layer 130 can be made of a plastic material, and each of the first outer layer 110 and the second outer layer 120 can be made of a black carbon-containing material, such as black carbon fibers. Therefore, the light blocking sheet 100 is made of the composite material, which is favorable to reduce the thickness of the light blocking sheet 100. Moreover, when the first outer layer 110 and the second outer layer 120 are made of black carbon fibers, the strength and the ability for eliminating lights can be enhanced simultaneously. Specifically, the plastic material can be polycarbonate (PC), black or transparent polyethylene terephthalate (PET), polymethylmethacrylate (PMMA) or a combination thereof.

When the minimum diameter of the substrate opening 131 is ϕsmin, the diameter of the first opening 111 is ϕ1, and the diameter of the second opening 121 is ϕ2, the following conditions can be satisfied: 2.0 μm<(ϕsmin−ϕ1)/2<200 μm; and 2.0 μm<(ϕsmin−ϕ2)/2<200 μm. Therefore, the differences of diameters are proper, so that the reflected lights and the time for manufacturing the air layer 140 can be reduced simultaneously. Preferably, the following conditions can be satisfied: 3.0 μm<(ϕsmin−ϕ1)/2<85 μm; and 3.0 μm<(ϕsmin−ϕ2)/2<85 μm.

When a length parallel to the central axis Z of the air layer 140 is d, the following condition can be satisfied: 5 μm<d<50 μm. Therefore, the travel path of the stray light can be reduced. Preferably, the following condition can be satisfied: 5 μm<d<49 μm.

When a thickness of the light blocking sheet 100 is t, the following condition can be satisfied: 5 μm<t<49 μm. Therefore, the thickness of the light blocking sheet 100 is proper, which can reduce the time and cost for manufacturing the air layer 140.

When the length parallel to the central axis Z of the air layer 140 is d, and the thickness of the light blocking sheet 100 is t, the following condition can be satisfied: 0.12<d/t<0.67. Therefore, the material consumption and the production cost of the process can be reduced.

When the diameter of the first opening 111 is ϕ1, and the diameter of the second opening 121 is ϕ2, the following condition can be satisfied: 0.93<ϕ1/ϕ2<1.07. Therefore, it is favorable to form the first opening 111 and the second opening 121 by stamping or laser cutting, which can enhance the production efficiency.

When a maximum outer diameter of the light blocking sheet 100 is ϕ, and the thickness of the light blocking sheet 100 is t, the following condition can be satisfied: 1<1000t/ϕ<50. Therefore, a larger light blocking range and a smaller volume can be provided.

A thickness of each of the inner substrate layer 130, the first outer layer 110 and the second outer layer 120 can be uniform. Therefore, the fast and mass production can be achieved. The raw material can be supplied in the form of material band, which is favorable for the subsequent processing. "The thickness can be uniform" refers that the thickness is identical. That is, the thickness of the inner substrate layer 130 parallel to the central axis Z is identical except the substrate opening 131; the thickness of the first outer layer 110 parallel to the central axis Z is identical except the first opening 111; the thickness of the second outer layer 120 parallel to the central axis Z is identical except the second opening 121.

Figure 3:
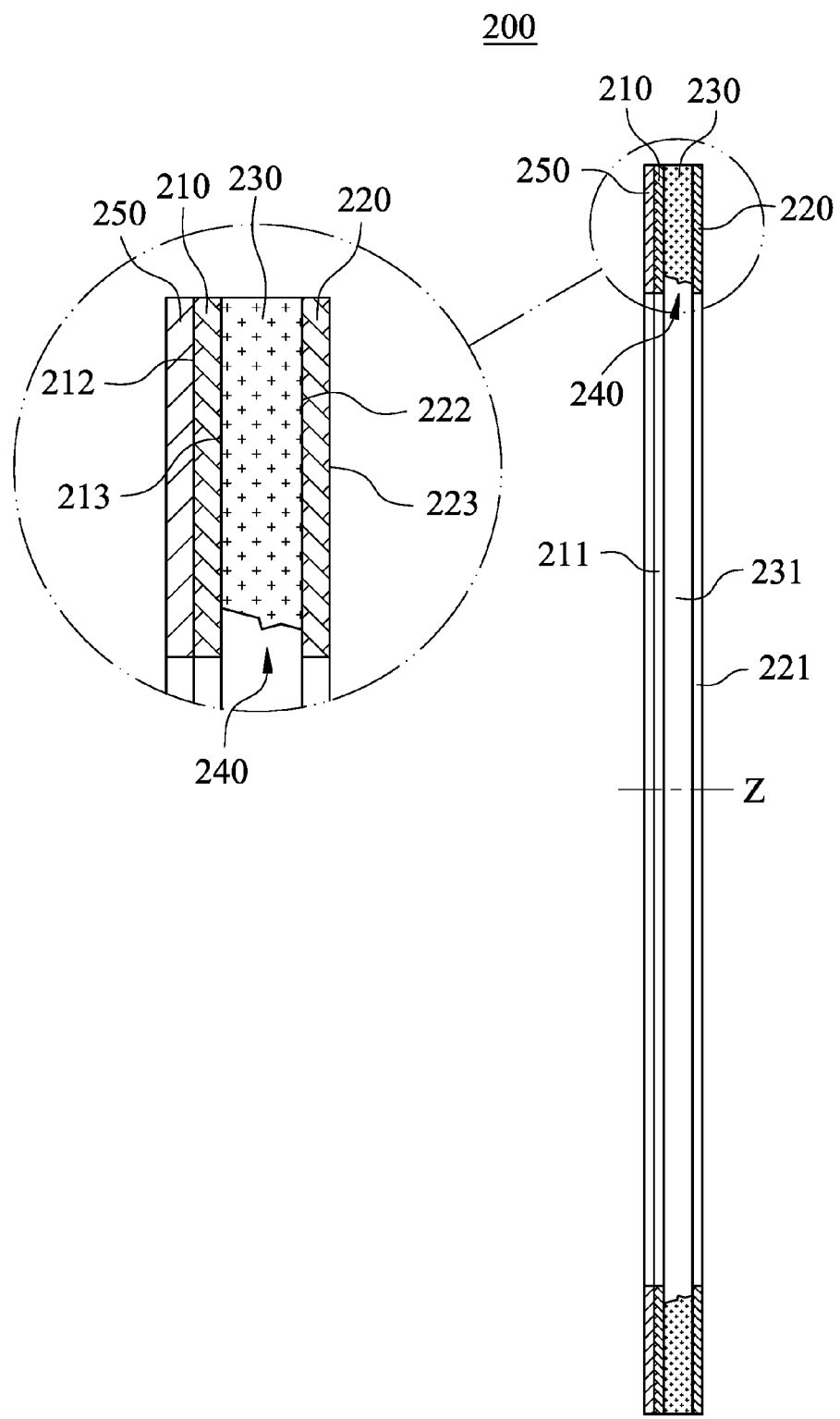
FIG. 3 is a cross-sectional view of a light blocking sheet according to another embodiment of the present disclosure.

FIG. 3 is a cross-sectional view of a light blocking sheet 200 according to another embodiment of the present disclosure. In FIG. 3, the light blocking sheet 200 includes a first outer layer 210, a second outer layer 220, an inner substrate layer 230 and a central axis Z. The first outer layer 210 includes a first opening 211, and the second outer layer 220 includes a second opening 221. The inner substrate layer 230 disposed between the first outer layer 210 and the second outer layer 220 connects the first outer layer 210 to the second outer layer 220. The inner substrate layer 230 includes a substrate opening 231. The central axis Z is coaxial with the first opening 211, the second opening 221 and the substrate opening 231.

Specifically, the first outer layer 210 includes a first surface 212 facing outward and a second surface 213 facing inward. The second outer layer 220 includes a first surface 222 facing inward and a second surface 223 facing outward. The first outer layer 210 is connected with the inner substrate layer 230 via the second surface 213, and the second outer layer 220 is connected with the inner substrate layer 230 via the first surface 222. Moreover, the first opening 211, the second opening 221 and the substrate opening 231 are correspondent with one another. An inner space is defined by the first outer layer 210, the second outer layer 220 and the inner substrate layer 230, and the inner space is communicated with the substrate opening 231. In the embodiment, no other materials are disposed in the inner space. That is, the inner space is an air layer 240.

At least one of the first surface 212 of the first outer layer 210 and the second surface 223 of the second outer layer 220 can include an anti-reflection film 250 coated thereon. Therefore, the effect for attenuating reflected light of the light blocking sheet 200 can be enhanced, and the material used to manufacture the light blocking sheet 200 can be broadened.

In the embodiment, the anti-reflection film 250 can be coated only on the first surface 212 of the first outer layer 210. In other embodiments, the anti-reflection film 250 can be coated only on the second surface 223 of the second outer layer 220. Therefore, the effect for identifying front and back can be provided.

In other embodiments, the anti-reflection films 250 can be coated on the first surface 212 of the first outer layer 210 and the second surface 223 of the second outer layer 220. Therefore, the effect for attenuating reflected light of the light blocking sheet 200 can be further enhanced, and the material used to manufacture the light blocking sheet 200 can be further broadened.

The anti-reflection film 250 can include a silicon dioxide material layer. Therefore, the anti-oxidation effect of the light blocking sheet 200 can be enhanced, which can reduce the extra influence of processing. Specifically, the anti-reflection film 250 can be a multi-film structure, which includes at least one silicon dioxide material layer.

The other details of the light blocking sheet 200 can be the same as that of the light blocking sheet 100 in FIGS. 2A-2C, and will not be repeated herein.

Imaging Lens Module

Figure 13:
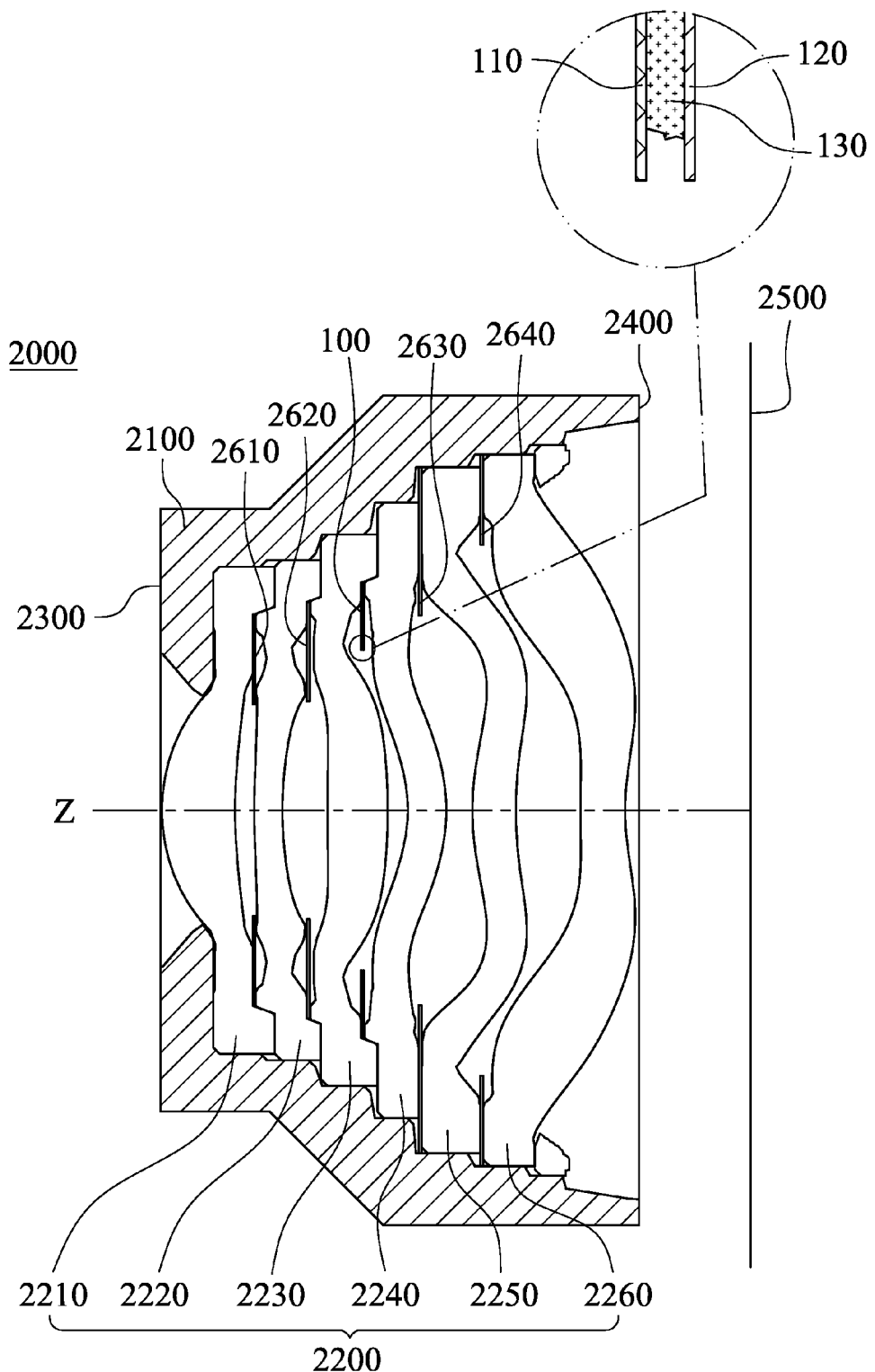
FIG. 13 is a schematic view of an imaging lens module according to yet another embodiment of the present disclosure.

FIG. 13 is a schematic view of an imaging lens module 2000 according to yet another embodiment of the present disclosure. In FIG. 13, the imaging lens module 2000 includes a barrel 2100, an optical lens assembly 2200 and the light blocking sheet 100. The optical lens assembly 2200 is disposed in the barrel 2100, and the light blocking sheet 100 is disposed in the barrel 2100. Therefore, the light can be effectively blocked, and the reflected intensity of the stray light into the imaging lens module 2000 can be reduced. Accordingly, the image quality of the imaging lens module 2000 can be improved.

Specifically, the imaging lens module 2000 can further include an object-side surface 2300, an image-side surface 2400 and an image surface 2500. The object-side surface 2300 faces an imaged object (not shown), and the image-side surface 2400 faces the image surface 2500. The optical lens assembly 2200 can include at least two lens elements (2210, 2220, 2230, 2240, 2250, 2260), and the light blocking sheet 100 is adjacent to at least one of the lens elements (2210, 2220, 2230, 2240, 2250, 2260). Other spacing elements (2610, 2620, 2630, 2640) can be disposed between two of the lens elements (2210, 2220, 2230, 2240, 2250, 2260).

More specifically, the optical lens assembly 2200 can include a first lens element 2210, a second lens element 2220, a third lens element 2230, a fourth lens element 2240, a fifth lens element 2250 and a sixth lens element 2260. The light blocking sheet 100 is disposed between the third lens element 2230 and the fourth lens element 2240. The first surface 112 (shown in FIG. 2C) of first outer layer 110 of the light blocking sheet 100 corresponds to the object-side surface 2300 of the imaging lens module 2000. The second surface 123 (shown in FIG. 2C) of second outer layer 120 of the light blocking sheet 100 corresponds to the image-side surface 2400 of the imaging lens module 2000. A spacing element 2610 is disposed between the first lens element 2210 and the second lens element 2220. A spacing element 2620 is disposed between the second lens element 2220 and the third lens element 2230. A spacing element 2630 is disposed between the fourth lens element 2240 and the fifth lens element 2250. A spacing element 2640 is disposed between the fifth lens element 2250 and the sixth lens element 2260. In the embodiment, the position and the number of the light blocking sheet 100 is only exemplary. In practical, the light blocking sheet 100 can be disposed between any two of the first lens element 2210, the second lens element 2220, the third lens element 2230, the fourth lens element 2240, the fifth lens element 2250 and the sixth lens element 2260. Moreover, the spacing element 2610, the spacing element 2620, the spacing element 2630 and/or the spacing element 2640 can be replaced by the light blocking sheet 100.

Furthermore, at least one of the first surface 112 of first outer layer 110 and the second surface 123 of second outer layer 120 of the light blocking sheet 100 can include an anti-reflection film (not shown) coated thereon. The details of the anti-reflection film can be the same as that in FIG. 3, and will not be repeated herein. Therefore, the reflection of lights can be reduced, and the image quality of the imaging lens module 2000 can be enhanced.

Electronic Apparatus

Figure 14:
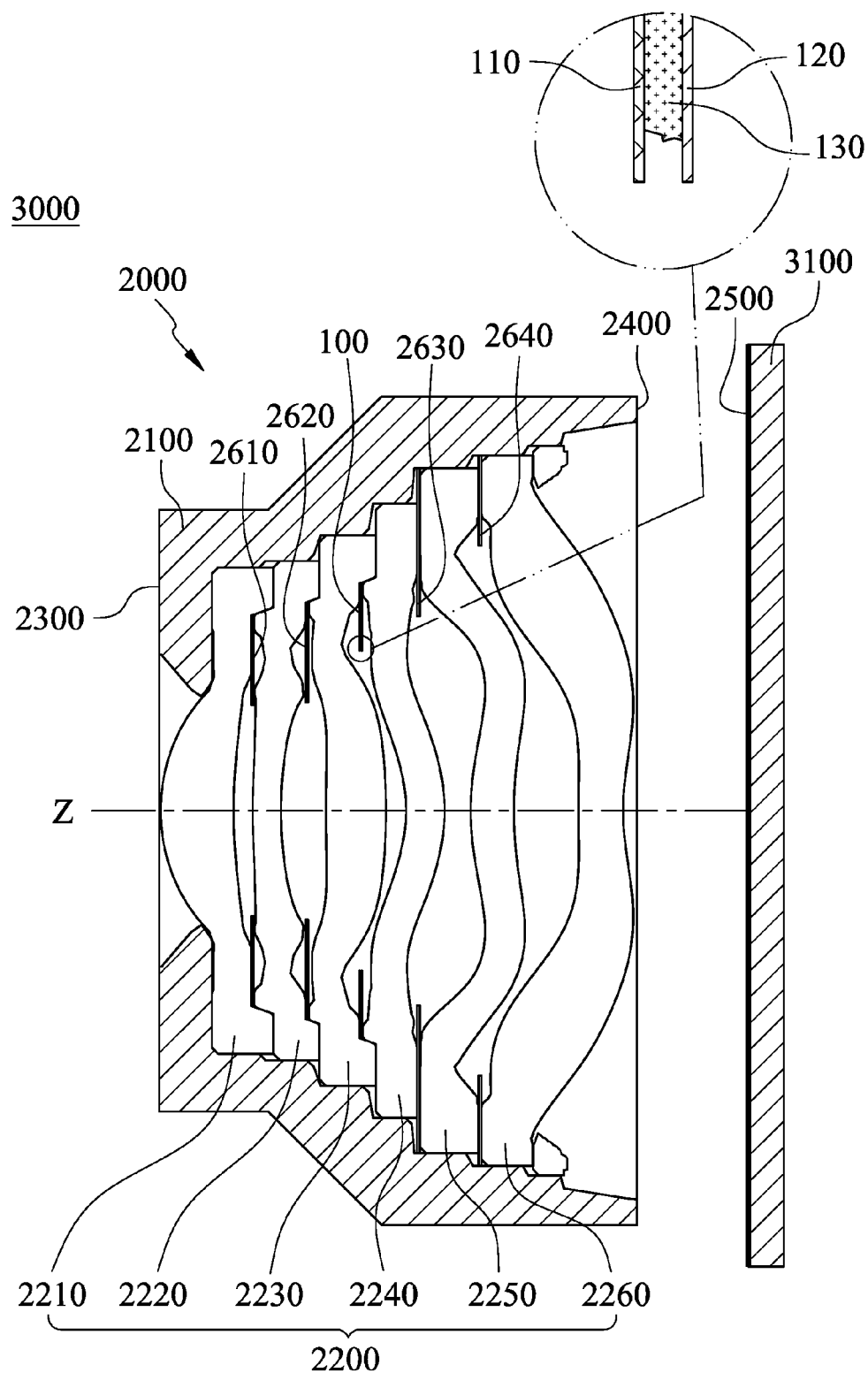
FIG. 14 is a schematic view of an electronic apparatus according to further another embodiment of the present disclosure.

FIG. 14 is a schematic view of an electronic apparatus 3000 according to further another embodiment of the present disclosure. In FIG. 14, the electronic apparatus 3000 includes the imaging lens module 2000 in FIG. 13 and an image sensor 3100. The image sensor 3100 is disposed on the image surface 2500 of the imaging lens module 2000. Therefore, the reflection of the stray light can be effectively reduced, and the image quality can be maintained, so that the demand for high-end image specifications of the electronic apparatus 3000 can be satisfied. The electronic apparatus 3000 can further include but not limited to a display, a control unit, a storage unit, a random access memory unit (RAM), a read only memory unit (ROM) or a combination thereof. Moreover, the electronic apparatus 3000 can be applied to but is not limited to a 3D (three-dimensional) image capturing applications, in products such as digital cameras, mobile devices, digital tablets, smart TV, surveillance devices, game consoles with motion sensing function, vehicle cameras such as driving recording systems and rear view camera systems, aerial photography devices, sports photography equipment, all kinds of smart electronics and wearable devices.

1st Example

Figure 4:
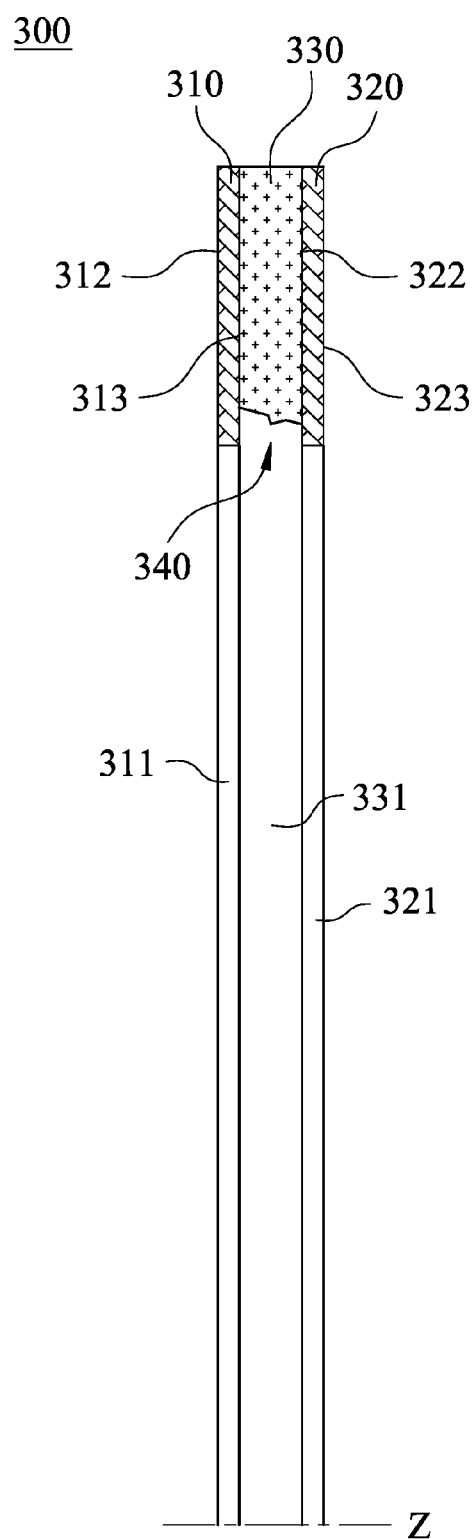
FIG. 4 is a partially cross-sectional view of a light blocking sheet according to the 1st example of the present disclosure.

FIG. 4 is a partially cross-sectional view of a light blocking sheet 300 according to the 1st example of the present disclosure. A view angle of FIG. 4 is the same as that in FIG. 2C, and FIG. 4 only shows a half of the cross section of the light blocking sheet 300. In FIG. 4, the light blocking sheet 300 includes a first outer layer 310, a second outer layer 320, an inner substrate layer 330, an air layer 340 and a central axis Z. The first outer layer 310 includes a first opening 311. The second outer layer 320 includes a second opening 321. The inner substrate layer 330 disposed between the first outer layer 310 and the second outer layer 320 connects the first outer layer 310 to the second outer layer 320. The inner substrate layer 330 includes a substrate opening 331. The air layer 340 is located between the first outer layer 310 and the second outer layer 320, and is close to the first opening 311 and the second opening 321. The central axis Z is coaxial with the first opening 311, the second opening 321 and the substrate opening 331.

Specifically, the first outer layer 310 includes a first surface 312 facing outward and a second surface 313 facing inward. The second outer layer 320 includes a first surface 322 facing inward and a second surface 323 facing outward. The first outer layer 310 is connected with the inner substrate layer 330 via the second surface 313, and the second outer layer 320 is connected with the inner substrate layer 330 via the first surface 322. Moreover, a thickness of each of the first outer layer 310, the second outer layer 320 and the inner substrate layer 330 is uniform.

Each of the first outer layer 310 and the second outer layer 320 can be made of a black carbon-containing material, and the inner substrate layer 330 can be made of a plastic material. Each of the first surface 312 of the first outer layer 310 and the second surface 323 of the second outer layer 320 can include an anti-reflection film (shown in FIG. 3) coated thereon. The anti-reflection film can include a silicon dioxide material layer.

In the light blocking sheet 300 according to the 1st example, a length parallel to the central axis Z of the air layer 340 is d, a thickness of the light blocking sheet 300 is t, a diameter of the first opening 311 is ϕ1, a diameter of the second opening 321 is ϕ2, a minimum diameter of the substrate opening 331 is ϕsmin, and a maximum outer diameter of the light blocking sheet 300 is ϕ. The parameters of d, t, ϕ1, ϕ2, ϕsmin, and ϕ can refer to FIG. 2C. The values of d, t, d/t, ϕ1, ϕ2, ϕsmin, ϕ, (ϕsmin−ϕ1)/2, (ϕsmin−ϕ2)/2, ϕ1/ϕ2 and 1000t/ϕ of the 1st example are listed in Table 1.

TABLE 1

| 1st Example | | | |
|---|---|---|---|
| d (μm) | 17.5 | Φ (mm) | 3.25 |
| t (μm) | 29.5 | (Φsmin − Φ1)/2 (μm) | 6 |
| d/t | 0.59 | (Φsmin − Φ2)/2 (μm) | 6 |
| Φ1 (mm) | 2.5 | Φ1/Φ2 | 1 |
| Φ2 (mm) | 2.5 | 1000t/Φ | 9.08 |
| Φsmin (mm) | 2.5120 | | |

2nd Example

Figure 5:
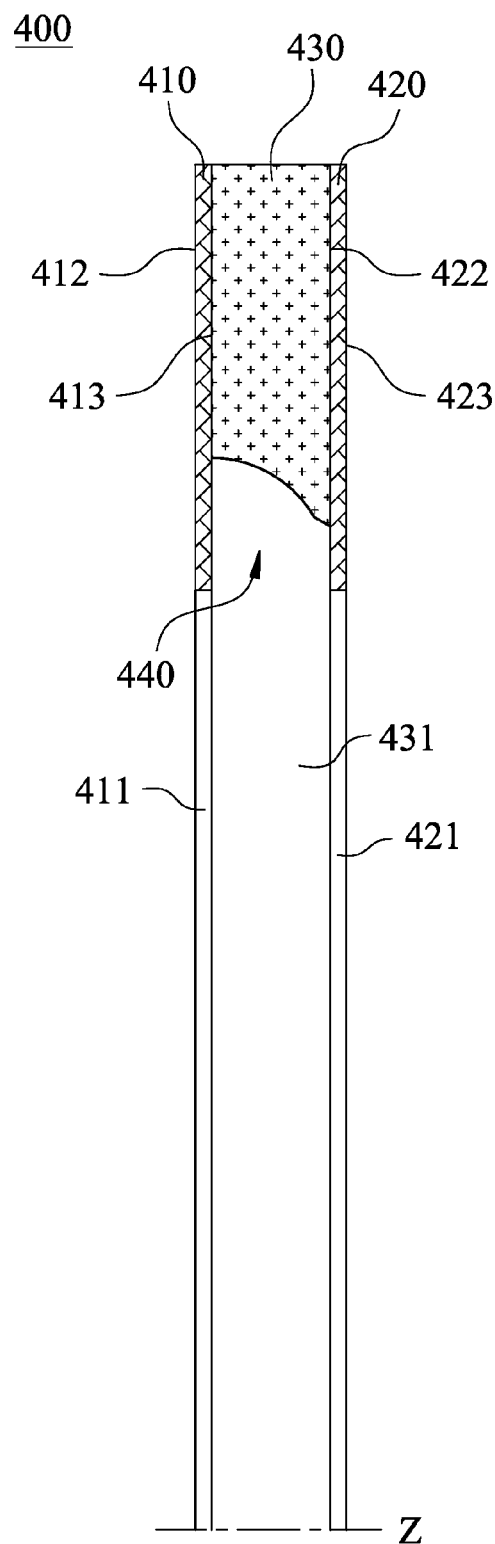
FIG. 5 is a partially cross-sectional view of a light blocking sheet according to the 2nd example of the present disclosure.

FIG. 5 is a partially cross-sectional view of a light blocking sheet 400 according to the 2nd example of the present disclosure. A view angle of FIG. 5 is the same as that in FIG. 2C, and FIG. 5 only shows a half of the cross section of the light blocking sheet 400. In FIG. 5, the light blocking sheet 400 includes a first outer layer 410, a second outer layer 420, an inner substrate layer 430, an air layer 440 and a central axis Z. The first outer layer 410 includes a first opening 411. The second outer layer 420 includes a second opening 421. The inner substrate layer 430 disposed between the first outer layer 410 and the second outer layer 420 connects the first outer layer 410 to the second outer layer 420. The inner substrate layer 430 includes a substrate opening 431. The air layer 440 is located between the first outer layer 410 and the second outer layer 420, and is close to the first opening 411 and the second opening 421. The central axis Z is coaxial with the first opening 411, the second opening 421 and the substrate opening 431.

Specifically, the first outer layer 410 includes a first surface 412 facing outward and a second surface 413 facing inward. The second outer layer 420 includes a first surface 422 facing inward and a second surface 423 facing outward. The first outer layer 410 is connected with the inner substrate layer 430 via the second surface 413, and the second outer layer 420 is connected with the inner substrate layer 430 via the first surface 422. Moreover, a thickness of each of the first outer layer 410, the second outer layer 420 and the inner substrate layer 430 is uniform.

Each of the first outer layer 410 and the second outer layer 420 can be made of a black carbon-containing material, and the inner substrate layer 430 can be made of a plastic material. Each of the first surface 412 of the first outer layer 410 and the second surface 423 of the second outer layer 420 can include an anti-reflection film (shown in FIG. 3) coated thereon. The anti-reflection film can include a silicon dioxide material layer.

In the light blocking sheet 400 according to the 2nd example, a length parallel to the central axis Z of the air layer 440 is d, a thickness of the light blocking sheet 400 is t, a diameter of the first opening 411 is ϕ1, a diameter of the second opening 421 is ϕ2, a minimum diameter of the substrate opening 431 is ϕsmin, and a maximum outer diameter of the light blocking sheet 400 is ϕ. The parameters of d, t, ϕ1, ϕ2, ϕsmin, and ϕ can refer to FIG. 2C. The values of d, t, d/t, ϕ1, ϕ2, ϕsmin, ϕ, (ϕsmin−ϕ1)/2, (ϕsmin−ϕ2)/2, ϕ1/ϕ2 and 1000t/ϕ of the 2nd example are listed in Table 2.

TABLE 2

| 2nd Example | | | |
|---|---|---|---|
| d (μm) | 29.5 | Φ (mm) | 3.05 |
| t (μm) | 37.5 | (Φsmin − Φ1)/2 (μm) | 15.95 |
| d/t | 0.79 | (Φsmin − Φ2)/2 (μm) | 15.95 |
| Φ1 (mm) | 1.65 | Φ1/Φ2 | 1 |
| Φ2 (mm) | 1.65 | 1000t/Φ | 12.30 |
| Φsmin (mm) | 1.6819 | | |

3rd Example

Figure 6:
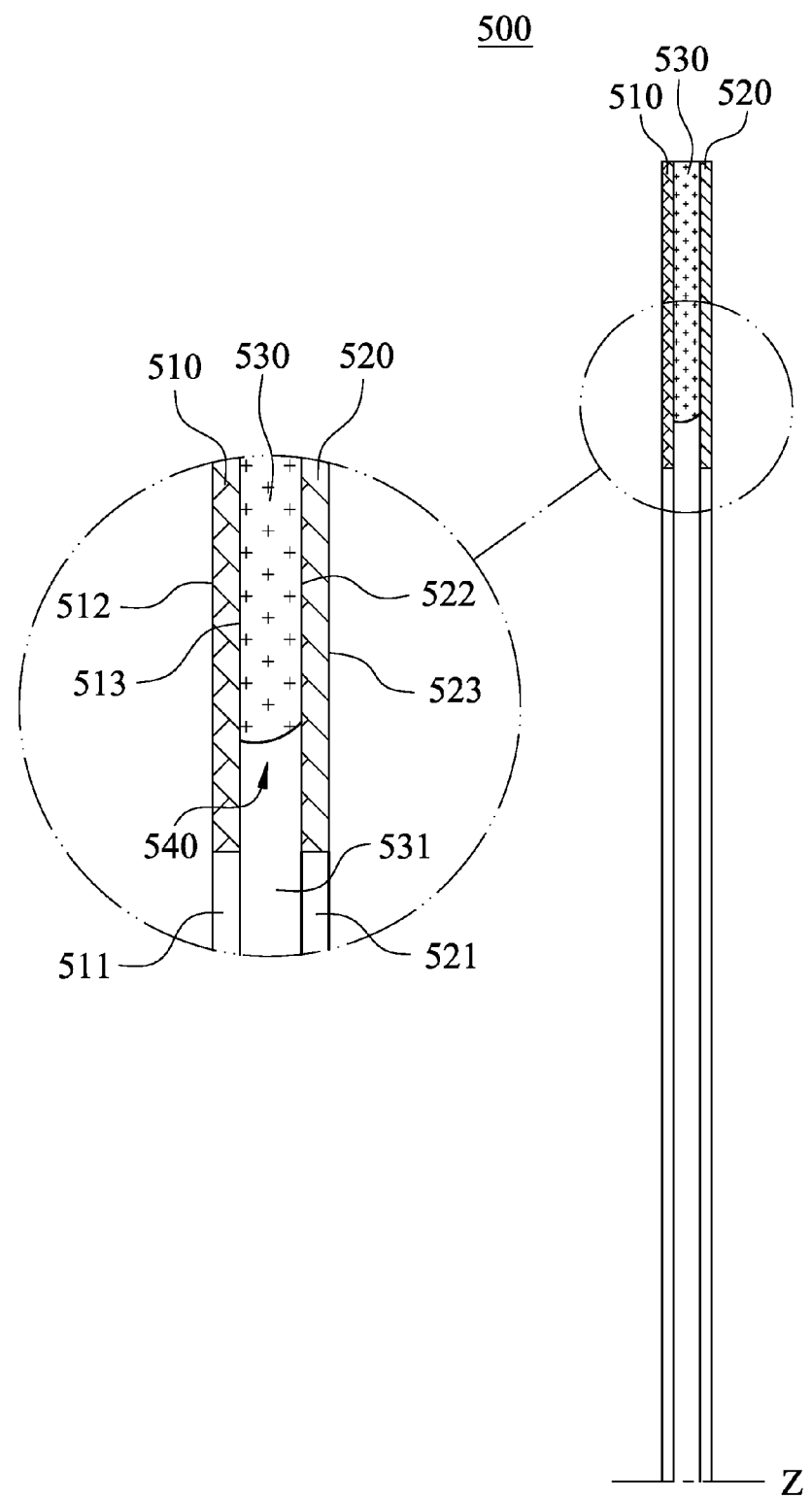
FIG. 6 is a partially cross-sectional view of a light blocking sheet according to the 3rd example of the present disclosure.

FIG. 6 is a partially cross-sectional view of a light blocking sheet 500 according to the 3rd example of the present disclosure. A view angle of FIG. 6 is the same as that in FIG. 2C, and FIG. 6 only shows a half of the cross section of the light blocking sheet 500. In FIG. 6, the light blocking sheet 500 includes a first outer layer 510, a second outer layer 520, an inner substrate layer 530, an air layer 540 and a central axis Z. The first outer layer 510 includes a first opening 511. The second outer layer 520 includes a second opening 521. The inner substrate layer 530 disposed between the first outer layer 510 and the second outer layer 520 connects the first outer layer 510 to the second outer layer 520. The inner substrate layer 530 includes a substrate opening 531. The air layer 540 is located between the first outer layer 510 and the second outer layer 520, and is close to the first opening 511 and the second opening 521. The central axis Z is coaxial with the first opening 511, the second opening 521 and the substrate opening 531.

Specifically, the first outer layer 510 includes a first surface 512 facing outward and a second surface 513 facing inward. The second outer layer 520 includes a first surface 522 facing inward and a second surface 523 facing outward. The first outer layer 510 is connected with the inner substrate layer 530 via the second surface 513, and the second outer layer 520 is connected with the inner substrate layer 530 via the first surface 522. Moreover, a thickness of each of the first outer layer 510, the second outer layer 520 and the inner substrate layer 530 is uniform.

Each of the first outer layer 510 and the second outer layer 520 can be made of black carbon fibers, and the inner substrate layer 530 can be made of a black plastic material of PET. Each of the first surface 512 of the first outer layer 510 and the second surface 523 of the second outer layer 520 can include an anti-reflection film (shown in FIG. 3) coated thereon. The anti-reflection film can include a silicon dioxide material layer.

In the light blocking sheet 500 according to the 3rd example, a length parallel to the central axis Z of the air layer 540 is d, a thickness of the light blocking sheet 500 is t, a diameter of the first opening 511 is $\phi 1$, a diameter of the second opening 521 is $\phi 2$, a minimum diameter of the substrate opening 531 is $\phi smin$, and a maximum outer diameter of the light blocking sheet 500 is $\phi$. The parameters of d, t, $\phi 1$, $\phi 2$, $\phi smin$, and $\phi$ can refer to FIG. 2C. The values of d, t, d/t, $\phi 1$, $\phi 2$, $\phi smin$, $\phi$, ($\phi smin-\phi 1$)/2, ($\phi smin-\phi 2$)/2, $\phi 1/\phi 2$ and $1000t/\phi$ of the 3rd example are listed in Table 3.

TABLE 3

| 3rd Example | | | |
|---|---|---|---|
| d (μm) | 9 | Φ (mm) | 3.55 |
| t (μm) | 17 | (Φsmin − Φ1)/2 (μm) | 15.95 |
| d/t | 0.53 | (Φsmin − Φ2)/2 (μm) | 15.95 |
| Φ1 (mm) | 3.04 | Φ1/Φ2 | 1 |
| Φ2 (mm) | 3.04 | 1000t/Φ | 4.79 |
| Φsmin (mm) | 3.0719 | | |

4th Example

Figure 7:
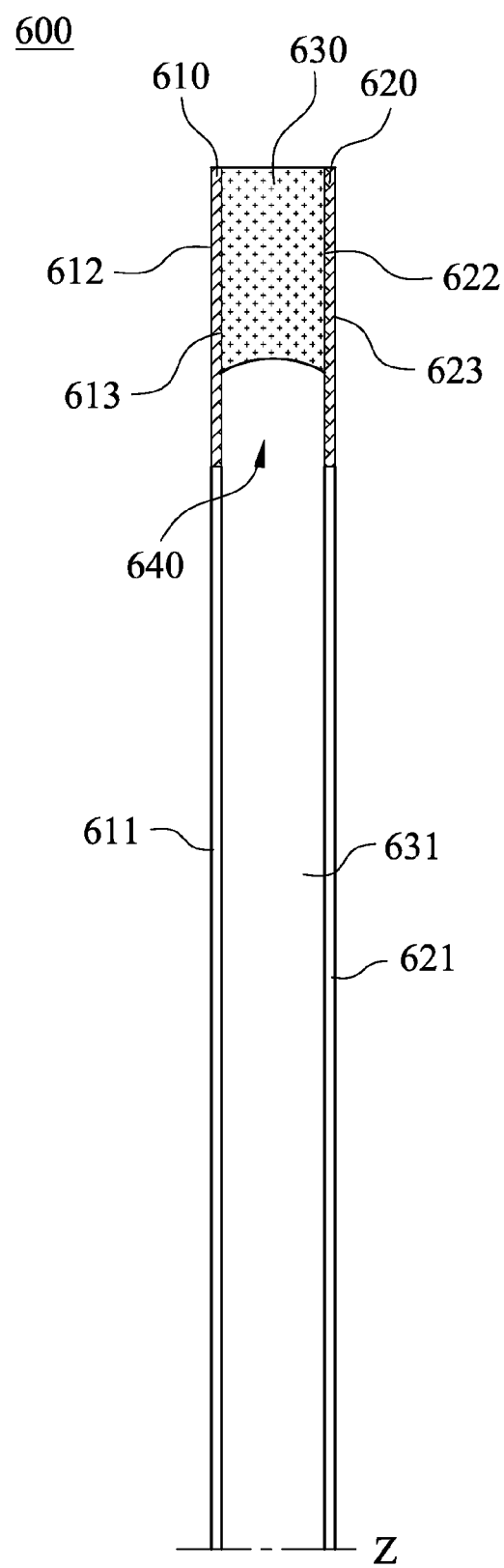
FIG. 7 is a partially cross-sectional view of a light blocking sheet according to the 4th example of the present disclosure.

FIG. 7 is a partially cross-sectional view of a light blocking sheet 600 according to the 4th example of the present disclosure. A view angle of FIG. 7 is the same as that in FIG. 2C, and FIG. 7 only shows a half of the cross section of the light blocking sheet 600. In FIG. 7, the light blocking sheet 600 includes a first outer layer 610, a second outer layer 620, an inner substrate layer 630, an air layer 640 and a central axis Z. The first outer layer 610 includes a first opening 611. The second outer layer 620 includes a second opening 621. The inner substrate layer 630 disposed between the first outer layer 610 and the second outer layer 620 connects the first outer layer 610 to the second outer layer 620. The inner substrate layer 630 includes a substrate opening 631. The air layer 640 is located between the first outer layer 610 and the second outer layer 620, and is close to the first opening 611 and the second opening 621. The central axis Z is coaxial with the first opening 611, the second opening 621 and the substrate opening 631.

Specifically, the first outer layer 610 includes a first surface 612 facing outward and a second surface 613 facing inward. The second outer layer 620 includes a first surface 622 facing inward and a second surface 623 facing outward. The first outer layer 610 is connected with the inner substrate layer 630 via the second surface 613, and the second outer layer 620 is connected with the inner substrate layer 630 via the first surface 622. Moreover, a thickness of each of the first outer layer 610, the second outer layer 620 and the inner substrate layer 630 is uniform.

Each of the first outer layer 610 and the second outer layer 620 can be made of black carbon fibers, and the inner substrate layer 630 can be made of a transparent plastic material of PET. Each of the first surface 612 of the first outer layer 610 and the second surface 623 of the second outer layer 620 can include an anti-reflection film (shown in FIG. 3) coated thereon. The anti-reflection film can include a silicon dioxide material layer.

In the light blocking sheet 600 according to the 4th example, a length parallel to the central axis Z of the air layer 640 is d, a thickness of the light blocking sheet 600 is t, a diameter of the first opening 611 is $\phi 1$, a diameter of the second opening 621 is $\phi 2$, a minimum diameter of the substrate opening 631 is $\phi smin$, and a maximum outer diameter of the light blocking sheet 600 is $\phi$. The parameters of d, t, $\phi 1$, $\phi 2$, $\phi smin$, and $\phi$ can refer to FIG. 2C. The values of d, t, d/t, $\phi 1$, $\phi 2$, $\phi smin$, $\phi$, ($\phi smin-\phi 1$)/2, ($\phi smin-\phi 2$)/2, $\phi 1/\phi 2$ and $1000t/\phi$ of the 4th example are listed in Table 4.

TABLE 4

| 4th Example | | | |
|---|---|---|---|
| d (μm) | 40 | Φ (mm) | 5.35 |
| t (μm) | 48 | (Φsmin − Φ1)/2 (μm) | 36.64 |
| d/t | 0.83 | (Φsmin − Φ2)/2 (μm) | 36.64 |
| Φ1 (mm) | 4.14 | Φ1/Φ2 | 1 |
| Φ2 (mm) | 4.14 | 1000t/Φ | 8.97 |
| Φsmin (mm) | 4.2133 | | |

5th Example

Figure 8:
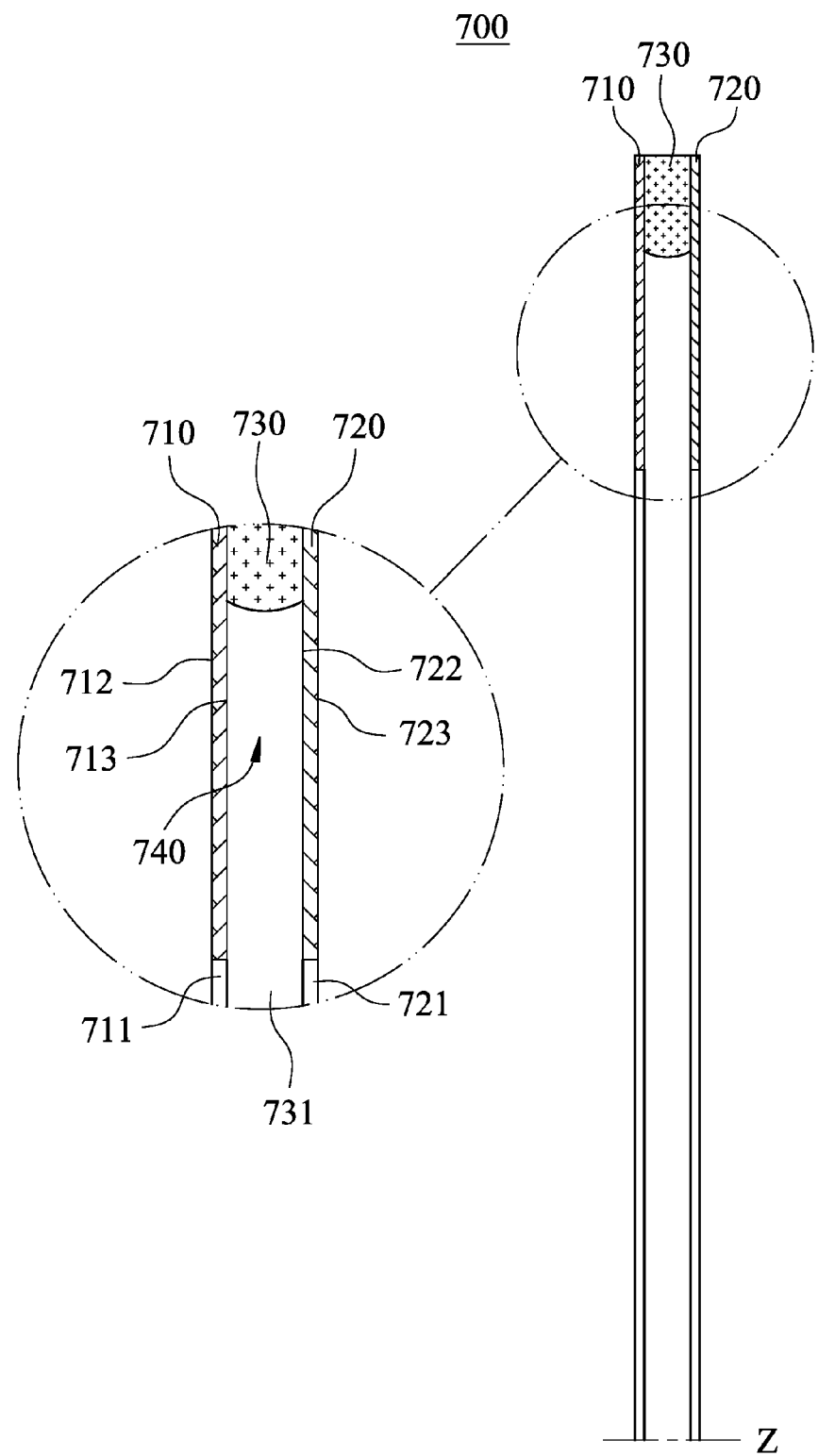
FIG. 8 is a partially cross-sectional view of a light blocking sheet according to the 5th example of the present disclosure.

FIG. 8 is a partially cross-sectional view of a light blocking sheet 700 according to the 5th example of the present disclosure. A view angle of FIG. 8 is the same as that in FIG. 2C, and FIG. 8 only shows a half of the cross section of the light blocking sheet 700. In FIG. 8, the light blocking sheet 700 includes a first outer layer 710, a second outer layer 720, an inner substrate layer 730, an air layer 740 and a central axis Z. The first outer layer 710 includes a first opening 711. The second outer layer 720 includes a second opening 721. The inner substrate layer 730 disposed between the first outer layer 710 and the second outer layer 720 connects the first outer layer 710 to the second outer layer 720. The inner substrate layer 730 includes a substrate opening 731. The air layer 740 is located between the first outer layer 710 and the second outer layer 720, and is close to the first opening 711 and the second opening 721. The central axis Z is coaxial with the first opening 711, the second opening 721 and the substrate opening 731.

Specifically, the first outer layer 710 includes a first surface 712 facing outward and a second surface 713 facing inward. The second outer layer 720 includes a first surface 722 facing inward and a second surface 723 facing outward. The first outer layer 710 is connected with the inner substrate layer 730 via the second surface 713, and the second outer layer 720 is connected with the inner substrate layer 730 via the first surface 722. Moreover, a thickness of each of the first outer layer 710, the second outer layer 720 and the inner substrate layer 730 is uniform.

Each of the first outer layer 710 and the second outer layer 720 can be made of a black carbon-containing material, and the inner substrate layer 730 can be made of a plastic material. Each of the first surface 712 of the first outer layer 710 and the second surface 723 of the second outer layer 720 can include an anti-reflection film (shown in FIG. 3) coated thereon. The anti-reflection film can include a silicon dioxide material layer.

In the light blocking sheet 700 according to the 5th example, a length parallel to the central axis Z of the air layer 740 is d, a thickness of the light blocking sheet 700 is t, a diameter of the first opening 711 is ϕ1, a diameter of the second opening 721 is ϕ2, a minimum diameter of the substrate opening 731 is ϕsmin, and a maximum outer diameter of the light blocking sheet 700 is ϕ. The parameters of d, t, ϕ1, ϕ2, ϕsmin, and ϕ can refer to FIG. 2C. The values of d, t, d/t, ϕ1, ϕ2, ϕsmin, ϕ, (ϕsmin−ϕ1)/2, (ϕsmin−ϕ2)/2, ϕ1/ϕ2 and 1000t/ϕ of the 5th example are listed in Table 5.

TABLE 5

| 5th Example | | | |
|---|---|---|---|
| d (μm) | 20 | Φ (mm) | 5.55 |
| t (μm) | 28 | (Φsmin − Φ1)/2 (μm) | 92 |
| d/t | 0.71 | (Φsmin − Φ2)/2 (μm) | 92 |
| Φ1 (mm) | 4.14 | Φ1/Φ2 | 1 |
| Φ2 (mm) | 4.14 | 1000t/Φ | 5.05 |
| Φsmin (mm) | 4.3240 | | |

6th Example

Figure 9:
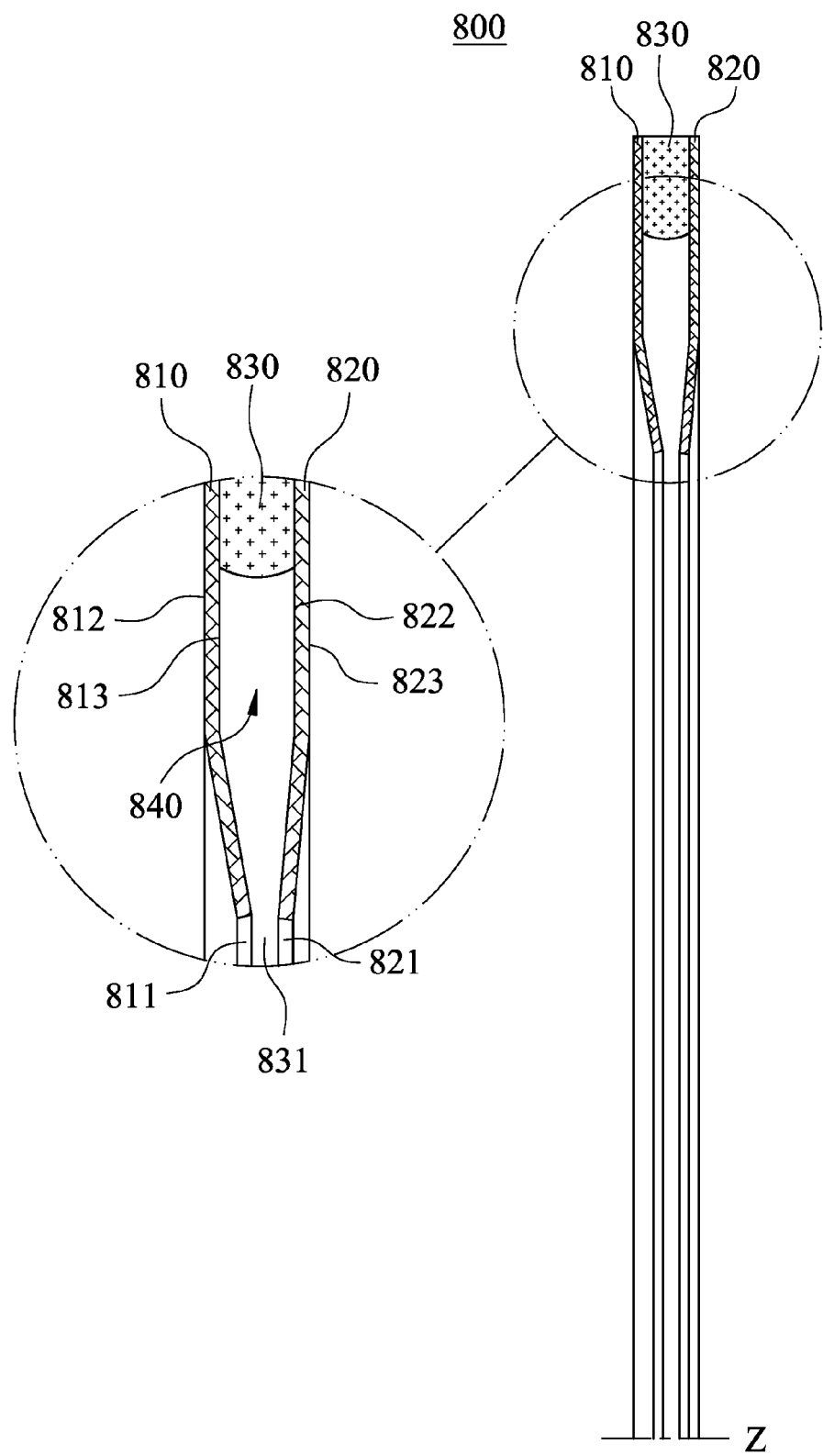
FIG. 9 is a partially cross-sectional view of a light blocking sheet according to the 6th example of the present disclosure.

FIG. 9 is a partially cross-sectional view of a light blocking sheet 800 according to the 6th example of the present disclosure. A view angle of FIG. 9 is the same as that in FIG. 2C, and FIG. 9 only shows a half of the cross section of the light blocking sheet 800. In FIG. 9, the light blocking sheet 800 includes a first outer layer 810, a second outer layer 820, an inner substrate layer 830, an air layer 840 and a central axis Z. The first outer layer 810 includes a first opening 811. The second outer layer 820 includes a second opening 821. The inner substrate layer 830 disposed between the first outer layer 810 and the second outer layer 820 connects the first outer layer 810 to the second outer layer 820. The inner substrate layer 830 includes a substrate opening 831. The air layer 840 is located between the first outer layer 810 and the second outer layer 820, and is close to the first opening 811 and the second opening 821. The central axis Z is coaxial with the first opening 811, the second opening 821 and the substrate opening 831.

Specifically, the first outer layer 810 includes a first surface 812 facing outward and a second surface 813 facing inward. The second outer layer 820 includes a first surface 822 facing inward and a second surface 823 facing outward. The first outer layer 810 is connected with the inner substrate layer 830 via the second surface 813, and the second outer layer 820 is connected with the inner substrate layer 830 via the first surface 822. Moreover, a thickness of each of the first outer layer 810, the second outer layer 820 and the inner substrate layer 830 is uniform.

Each of the first outer layer 810 and the second outer layer 820 can be made of a black carbon-containing material, and the inner substrate layer 830 can be made of a plastic material. Each of the first surface 812 of the first outer layer 810 and the second surface 823 of the second outer layer 820 can include an anti-reflection film (shown in FIG. 3) coated thereon. The anti-reflection film can include a silicon dioxide material layer.

In the light blocking sheet 800 according to the 6th example, a length parallel to the central axis Z of the air layer 840 is d, a thickness of the light blocking sheet 800 is t, a diameter of the first opening 811 is ϕ1, a diameter of the second opening 821 is ϕ2, a minimum diameter of the substrate opening 831 is ϕsmin, and a maximum outer diameter of the light blocking sheet 800 is ϕ. The parameters of d, t, ϕ1, ϕ2, ϕsmin, and ϕ can refer to FIG. 2C. The values of d, t, d/t, ϕ1, ϕ2, ϕsmin, ϕ, (ϕsmin−ϕ1)/2, (ϕsmin−ϕ2)/2, ϕ1/ϕ2 and 1000t/ϕ of the 6th example are listed in Table 6. In 6th Example, lengths parallel to the central axis Z of the air layer 840 are different (i.e., the values of d are different), and the value recorded in Table 6 is the minimum length (i.e., the minimum value of all the values of d).

TABLE 6

| 6th Example | | | |
|---|---|---|---|
| d (μm) | 7.15 | Φ (mm) | 5.55 |
| t (μm) | 28 | (Φsmin − Φ1)/2 (μm) | 91.8 |
| d/t | 0.26 | (Φsmin − Φ2)/2 (μm) | 91.8 |
| Φ1 (mm) | 4.14 | Φ1/Φ2 | 1 |
| Φ2 (mm) | 4.14 | 1000t/Φ | 5.05 |
| Φsmin (mm) | 4.3236 | | |

7th Example

Figure 10:
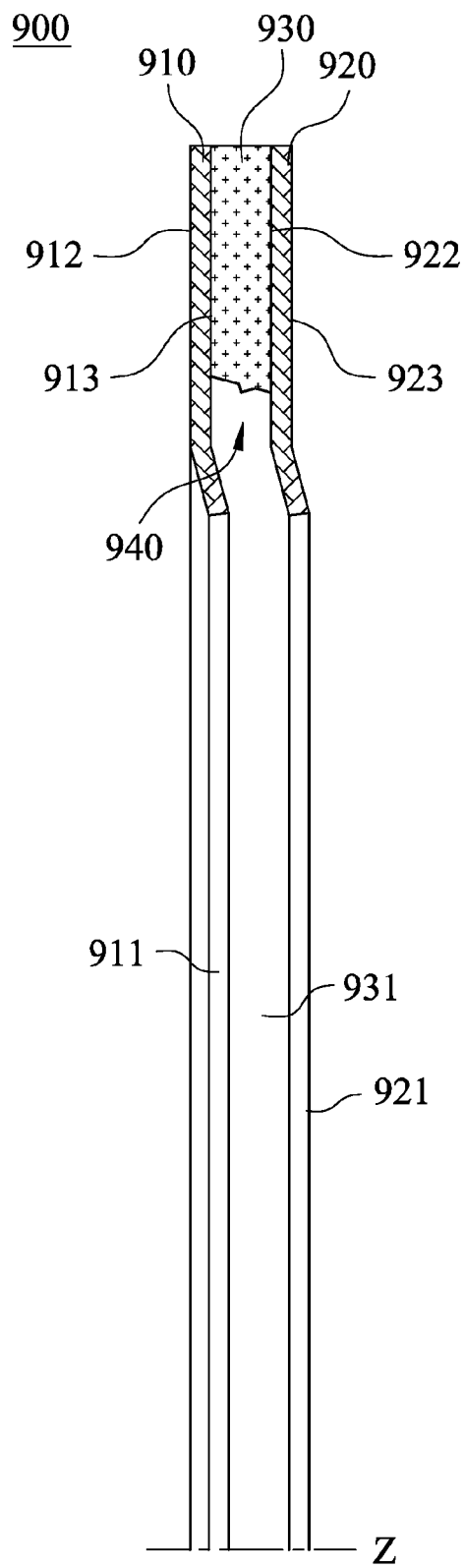
FIG. 10 is a partially cross-sectional view of a light blocking sheet according to the 7th example of the present disclosure.

FIG. 10 is a partially cross-sectional view of a light blocking sheet 900 according to the 7th example of the present disclosure. A view angle of FIG. 10 is the same as that in FIG. 2C, and FIG. 10 only shows a half of the cross section of the light blocking sheet 900. In FIG. 10, the light blocking sheet 900 includes a first outer layer 910, a second outer layer 920, an inner substrate layer 930, an air layer 940 and a central axis Z. The first outer layer 910 includes a first opening 911. The second outer layer 920 includes a second opening 921. The inner substrate layer 930 disposed between the first outer layer 910 and the second outer layer 920 connects the first outer layer 910 to the second outer layer 920. The inner substrate layer 930 includes a substrate opening 931. The air layer 940 is located between the first outer layer 910 and the second outer layer 920, and is close to the first opening 911 and the second opening 921. The central axis Z is coaxial with the first opening 911, the second opening 921 and the substrate opening 931.

Specifically, the first outer layer 910 includes a first surface 912 facing outward and a second surface 913 facing inward. The second outer layer 920 includes a first surface 922 facing inward and a second surface 923 facing outward. The first outer layer 910 is connected with the inner substrate layer 930 via the second surface 913, and the second outer layer 920 is connected with the inner substrate layer 930 via the first surface 922. Moreover, a thickness of each of the first outer layer 910, the second outer layer 920 and the inner substrate layer 930 is uniform.

Each of the first outer layer 910 and the second outer layer 920 can be made of a black carbon-containing material, and the inner substrate layer 930 can be made of a plastic material. Each of the first surface 912 of the first outer layer 910 and the second surface 923 of the second outer layer 920 can include an anti-reflection film (shown in FIG. 3) coated thereon. The anti-reflection film can include a silicon dioxide material layer.

In the light blocking sheet 900 according to the 7th example, a length parallel to the central axis Z of the air layer 940 is d, a thickness of the light blocking sheet 900 is t, a diameter of the first opening 911 is φ1, a diameter of the second opening 921 is φ2, a minimum diameter of the substrate opening 931 is φsmin, and a maximum outer diameter of the light blocking sheet 900 is φ. The parameters of d, t, φ1, φ2, φsmin, and φ can refer to FIG. 2C. The values of d, t, d/t, φ1, φ2, φsmin, φ, (φsmin−φ1)/2, (φsmin−φ2)/2, φ1/φ2 and 1000t/φ of the 7th example are listed in Table 7.

TABLE 7

7th Example

| | | | |
|---|---|---|---|
| d (μm) | 17.68 | Φ (mm) | 3.25 |
| t (μm) | 29.5 | (Φsmin − Φ1)/2 (μm) | 36 |
| d/t | 0.60 | (Φsmin − Φ2)/2 (μm) | 36 |
| Φ1 (mm) | 2.5 | Φ1/Φ2 | 1 |
| Φ2 (mm) | 2.5 | 1000t/Φ | 9.08 |
| Φsmin (mm) | 2.5720 | | |

8th Example

Figure 11:
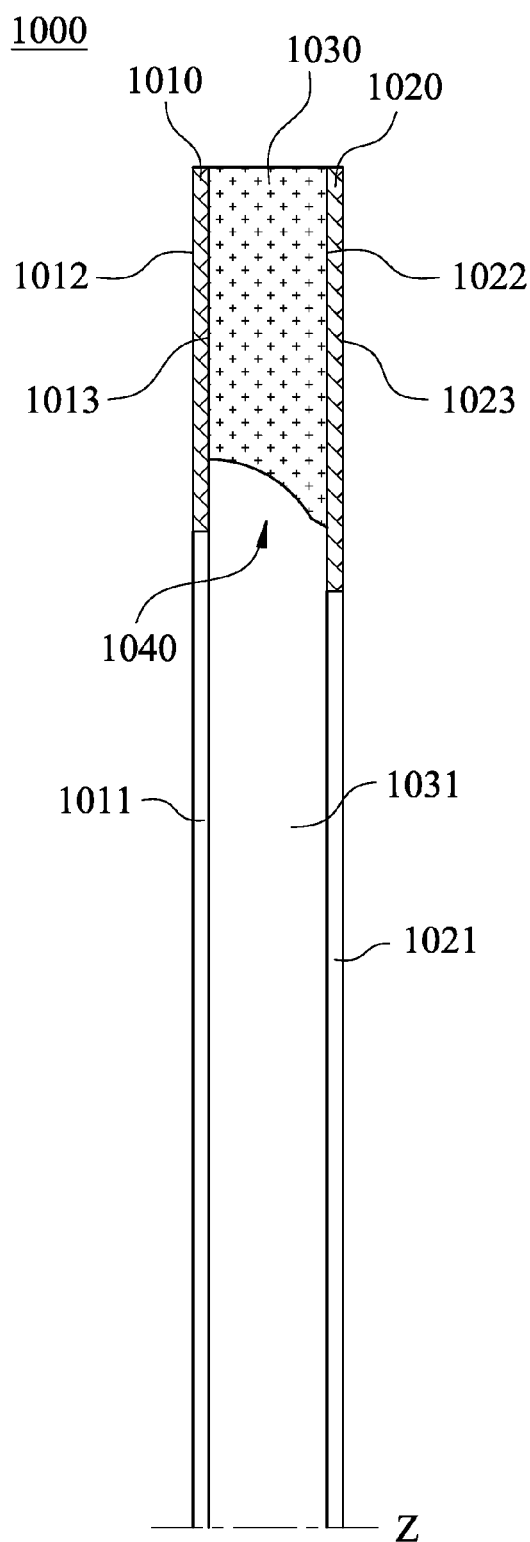
FIG. 11 is a partially cross-sectional view of a light blocking sheet according to the 8th example of the present disclosure.

FIG. 11 is a partially cross-sectional view of a light blocking sheet 1000 according to the 8th example of the present disclosure. A view angle of FIG. 11 is the same as that in FIG. 2C, and FIG. 11 only shows a half of the cross section of the light blocking sheet 1000. In FIG. 11, the light blocking sheet 1000 includes a first outer layer 1010, a second outer layer 1020, an inner substrate layer 1030, an air layer 1040 and a central axis Z. The first outer layer 1010 includes a first opening 1011. The second outer layer 1020 includes a second opening 1021. The inner substrate layer 1030 disposed between the first outer layer 1010 and the second outer layer 1020 connects the first outer layer 1010 to the second outer layer 1020. The inner substrate layer 1030 includes a substrate opening 1031. The air layer 1040 is located between the first outer layer 1010 and the second outer layer 1020, and is close to the first opening 1011 and the second opening 1021. The central axis Z is coaxial with the first opening 1011, the second opening 1021 and the substrate opening 1031.

Specifically, the first outer layer 1010 includes a first surface 1012 facing outward and a second surface 1013 facing inward. The second outer layer 1020 includes a first surface 1022 facing inward and a second surface 1023 facing outward. The first outer layer 1010 is connected with the inner substrate layer 1030 via the second surface 1013, and the second outer layer 1020 is connected with the inner substrate layer 1030 via the first surface 1022. Moreover, a thickness of each of the first outer layer 1010, the second outer layer 1020 and the inner substrate layer 1030 is uniform.

Each of the first outer layer 1010 and the second outer layer 1020 can be made of a black carbon-containing material, and the inner substrate layer 1030 can be made of a plastic material. Each of the first surface 1012 of the first outer layer 1010 and the second surface 1023 of the second outer layer 1020 can include an anti-reflection film (shown in FIG. 3) coated thereon. The anti-reflection film can include a silicon dioxide material layer.

In the light blocking sheet 1000 according to the 8th example, a length parallel to the central axis Z of the air layer 1040 is d, a thickness of the light blocking sheet 1000 is t, a diameter of the first opening 1011 is φ1, a diameter of the second opening 1021 is φ2, a minimum diameter of the substrate opening 1031 is φsmin, and a maximum outer diameter of the light blocking sheet 1000 is φ. The parameters of d, t, φ1, φ2, φsmin, and φ can refer to FIG. 2C. The values of d, t, d/t, φ1, φ2, φsmin, φ, (φsmin−φ1)/2, (φsmin−φ2)/2, φ1/φ2 and 1000t/φ of the 8th example are listed in Table 8.

TABLE 8

8th Example

| | | | |
|---|---|---|---|
| d (μm) | 29.5 | Φ (mm) | 3.05 |
| t (μm) | 37.5 | (Φsmin − Φ1)/2 (μm) | 30.95 |
| d/t | 0.79 | (Φsmin − Φ2)/2 (μm) | 15.95 |
| Φ1 (mm) | 1.62 | Φ1/Φ2 | 0.98 |
| Φ2 (mm) | 1.65 | 1000t/Φ | 12.30 |
| Φsmin (mm) | 1.6819 | | |

9th Example

Figure 12:
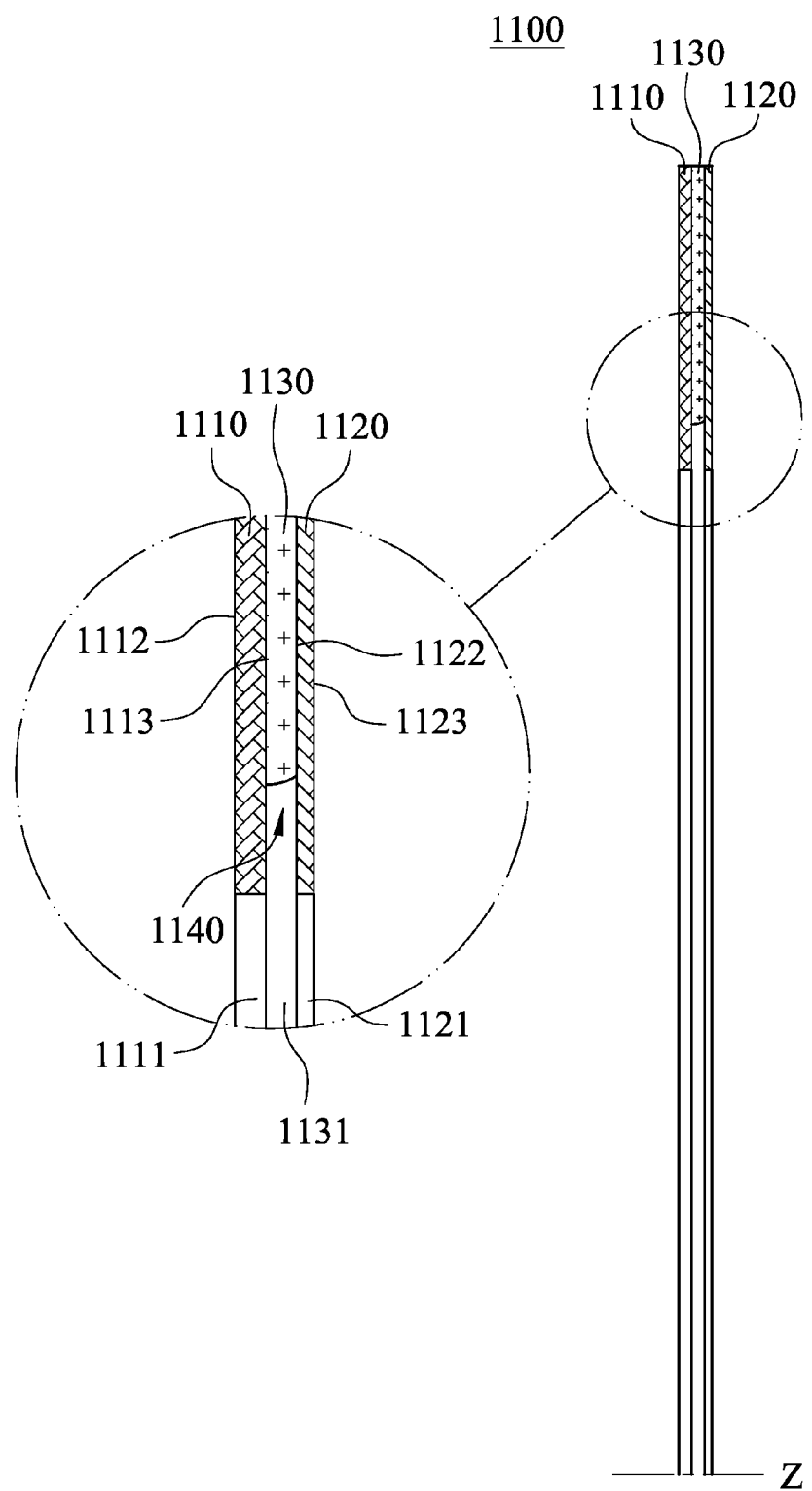
FIG. 12 is a partially cross-sectional view of a light blocking sheet according to the 9th example of the present disclosure.

FIG. 12 is a partially cross-sectional view of a light blocking sheet 1100 according to the 9th example of the present disclosure. A view angle of FIG. 12 is the same as that in FIG. 2C, and FIG. 12 only shows a half of the cross section of the light blocking sheet 1100. In FIG. 12, the light blocking sheet 1100 includes a first outer layer 1110, a second outer layer 1120, an inner substrate layer 1130, an air layer 1140 and a central axis Z. The first outer layer 1110 includes a first opening 1111. The second outer layer 1120 includes a second opening 1121. The inner substrate layer 1130 disposed between the first outer layer 1110 and the second outer layer 1120 connects the first outer layer 1110 to the second outer layer 1120. The inner substrate layer 1130 includes a substrate opening 1131. The air layer 1140 is located between the first outer layer 1110 and the second outer layer 1120, and is close to the first opening 1111 and the second opening 1121. The central axis Z is coaxial with the first opening 1111, the second opening 1121 and the substrate opening 1131.

Specifically, the first outer layer 1110 includes a first surface 1112 facing outward and a second surface 1113 facing inward. The second outer layer 1120 includes a first surface 1122 facing inward and a second surface 1123 facing outward. The first outer layer 1110 is connected with the inner substrate layer 1130 via the second surface 1113, and the second outer layer 1120 is connected with the inner substrate layer 1130 via the first surface 1122. Moreover, a thickness of each of the first outer layer 1110, the second outer layer 1120 and the inner substrate layer 1130 is uniform.

Each of the first outer layer 1110 and the second outer layer 1120 can be made of a black carbon-containing material, and the inner substrate layer 1130 can be made of a plastic material. Each of the first surface 1112 of the first outer layer 1110 and the second surface 1123 of the second outer layer 1120 can include an anti-reflection film (shown in FIG. 3) coated thereon. The anti-reflection film can include a silicon dioxide material layer.

In the light blocking sheet 1100 according to the 9th example, a length parallel to the central axis Z of the air layer 1140 is d, a thickness of the light blocking sheet 1100 is t, a diameter of the first opening 1111 is φ1, a diameter of the second opening 1121 is φ2, a minimum diameter of the substrate opening 1131 is φsmin, and a maximum outer diameter of the light blocking sheet 1100 is φ. The parameters of d, t, φ1, φ2, φsmin, and φ can refer to FIG. 2C. The values of d, t, d/t, φ1, φ2, φsmin, φ, (φsmin−φ1)/2, (φsmin−φ2)/2, φ1/φ2 and 1000t/φ of the 9th example are listed in Table 9.

TABLE 9

9th Example

| | | | |
|---|---|---|---|
| d (μm) | 4.5 | Φ (mm) | 3.55 |
| t (μm) | 11.5 | (Φsmin − Φ1)/2 (μm) | 15.95 |
| d/t | 0.39 | (Φsmin − Φ2)/2 (μm) | 15.95 |
| Φ1 (mm) | 3.04 | Φ1/Φ2 | 1 |
| Φ2 (mm) | 3.04 | 1000t/Φ | 3.24 |
| Φsmin (mm) | 3.0719 | | |

10th Example

Figure 15A:
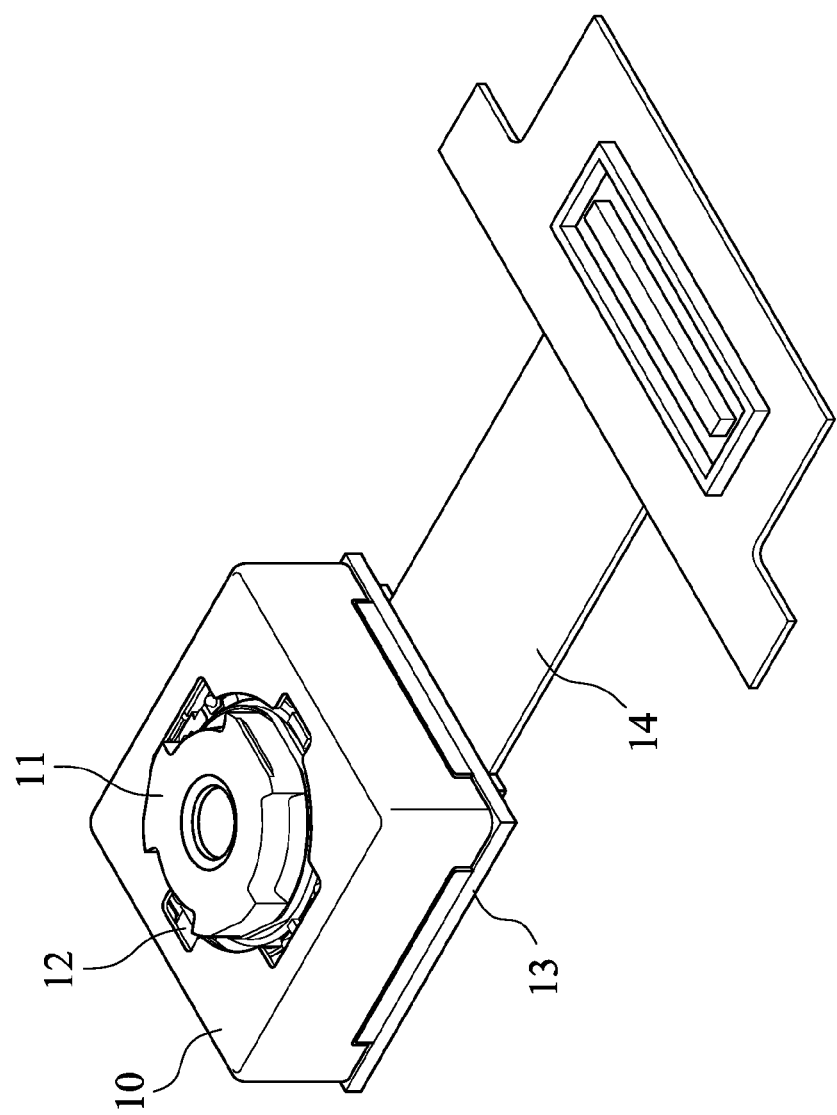
FIG. 15A is a schematic view of an image capturing device according to the 10th example of the present disclosure.

FIG. 15A is a schematic view of an image capturing device 10 according to the 10th example of the present disclosure. The image capturing device 10 of the 10th example is a camera module. The image capturing device 10 includes an imaging lens module 11, a driving assembly 12, an image sensor 13 and a conductor circuit 14. The imaging lens module 11 includes an optical lens assembly (not shown herein), the light blocking sheet of the 1st example of the present disclosure (not shown herein) and a barrel (its reference numeral is omitted). The optical lens assembly and the light blocking sheet are disposed in the barrel. In the image capturing device 10, lights are focused by the imaging lens module 11 for generating an image, the driving assembly 12 is used to assist the imaging lens module 11 into focus, then the image is formed on the image sensor 13, and the data of the image is outputted by the conductor circuit 14.

The driving assembly 12 can be an auto-focus module, and a driving method thereof can use a voice coil motor (VCM), a micro electro-mechanical system (MEMS), a piezoelectric system or a shape memory alloy system. The driving assembly 12 enables the imaging lens module 11 to obtain a preferable imaging position, so that the imaged object in different object distances can be imaged clearly. Moreover, the driving assembly 12 can be coordinated with a kinetic energy sensing element, such as an accelerator, a gyro or a Hall effect sensor. By adjusting the changes in different axial directions of the optical lens assembly, the blurry image resulting in the shaking of the shooting moment can be compensated, so that the image quality of dynamic scenes or low-light scenes can be enhanced. For example, an optical image stabilization (OIS) or an electronic image stabilization (EIS) can be featured with the driving assembly 12. Moreover, the image sensor 13 of the image capturing device 10 disposed on the image surface of the imaging lens module 11 can have the properties of high light sensitivity and low noise (such as CMOS and CCD), so that the excellent image quality of the imaging lens module 11 can be truly presented.

Figure 15B:
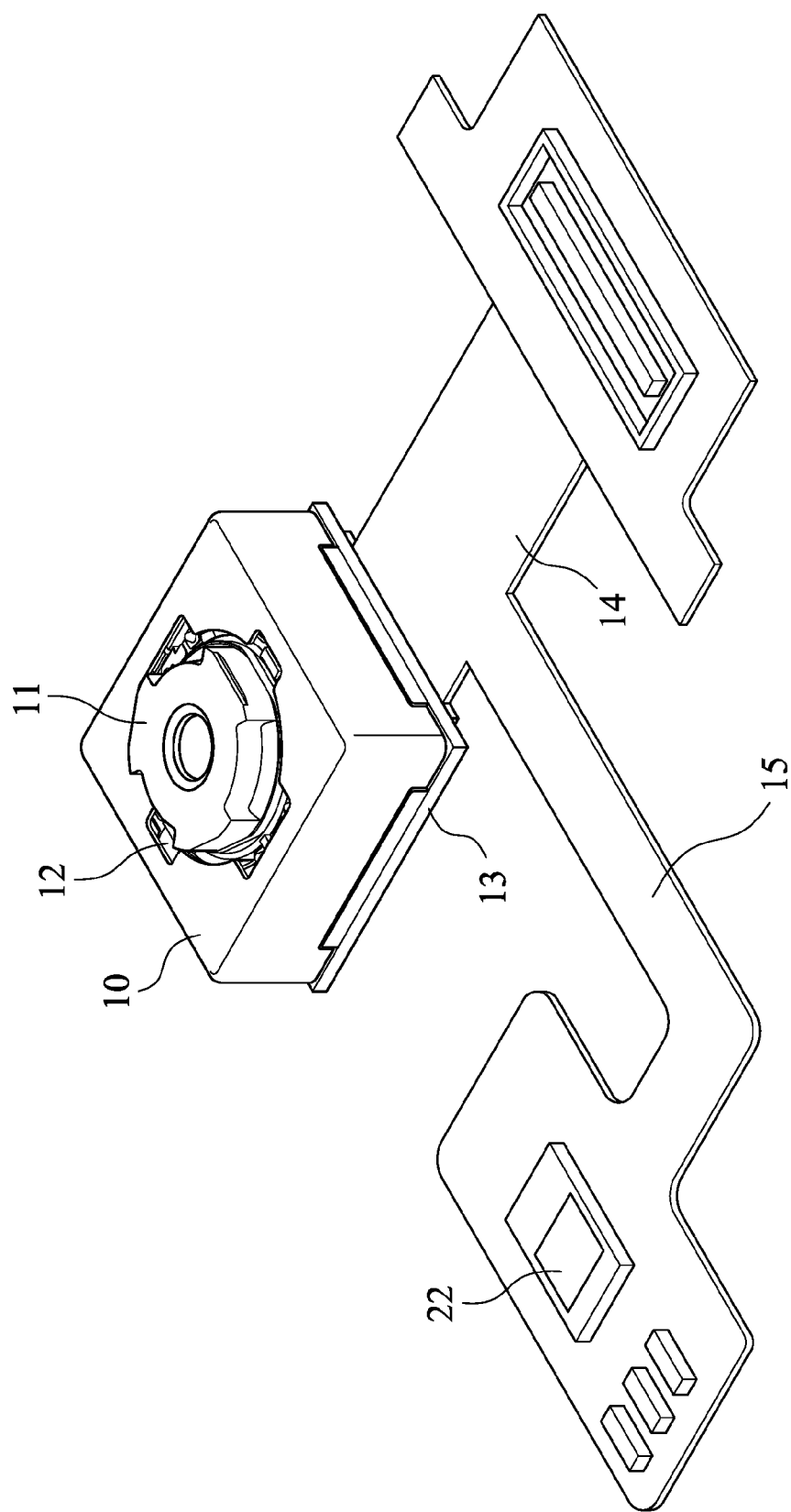
FIG. 15B is a schematic view showing the image capturing device in FIG. 15A connected with other modules.
Figure 15C:
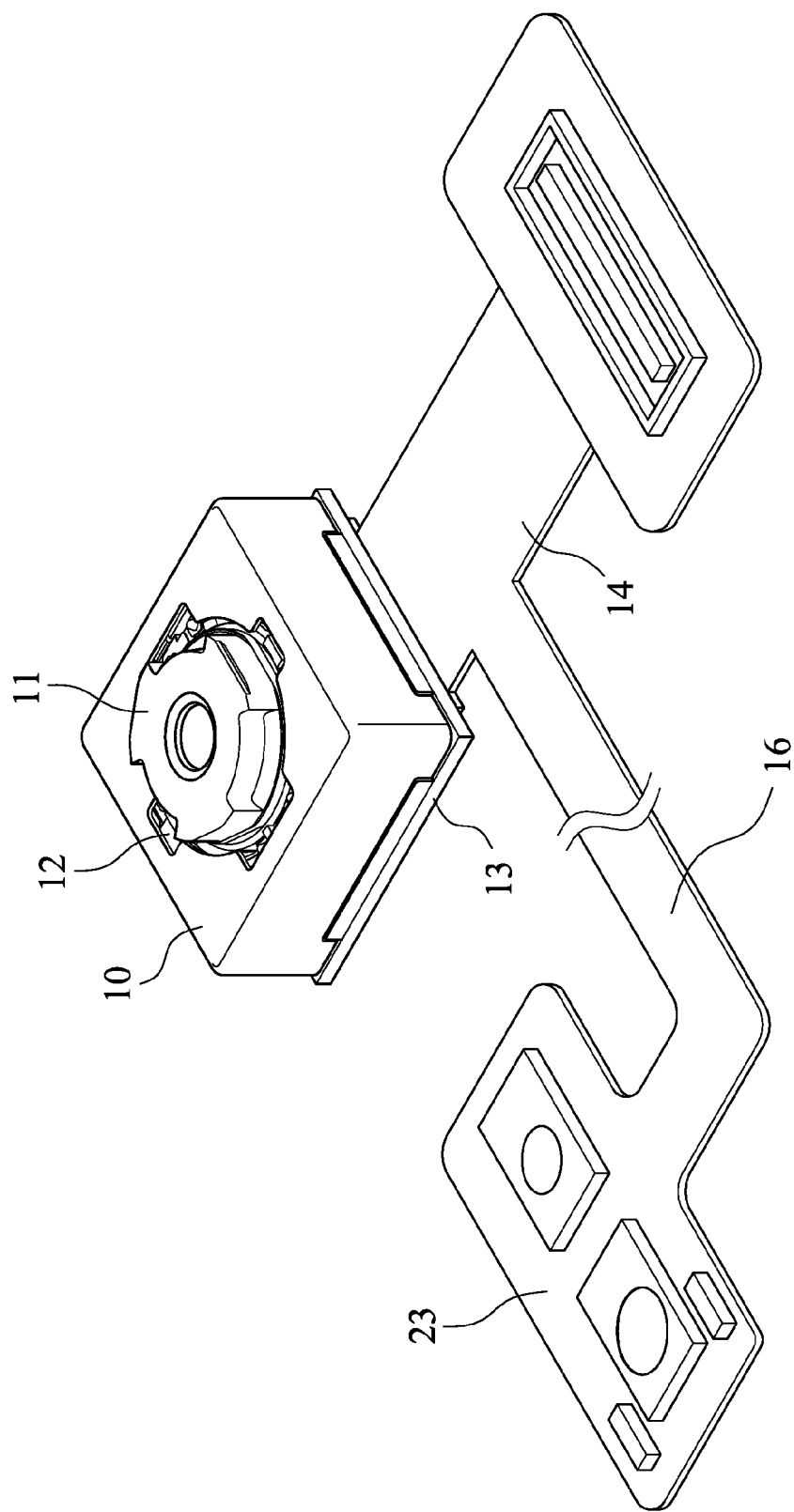
FIG. 15C is another schematic view showing the image capturing device in FIG. 15A connected with other modules.

In practical, the image capturing device 10 can be connected with other modules for giving the image capturing device 10 required functions. FIG. 15B is a schematic view showing the image capturing device 10 in FIG. 15A connected with other modules. In FIG. 15B, the image capturing device 10 is connected with the flash module 22 via a conductor circuit 15. Therefore, a light compensation function can be provided by the flash module 22, which is favorable for optimizing the image quality. FIG. 15C is another schematic view showing the image capturing device 10 in FIG. 15A connected with other modules. In FIG. 15C, the image capturing device 10 is connected with the auxiliary focusing module 23 via a conductor circuit 16. Therefore, the object distance of the imaged objected can be provided by the auxiliary focusing module 23, which is favorable for the image capturing device 10 to focus quickly. In FIG. 15B and FIG. 15C, the flash module 22 and the auxiliary focusing module 23 are only exemplary, and can be replaced by other modules according to practical demands. Moreover, the image capturing device 10 can be connected with only one module or can be connected with a plurality modules. Each of the conductor circuit 14, the conductor circuit 15 and the conductor circuit 16 can be but is not limited to a flexible printing circuit (FPC).

11th Example

Figure 16A:
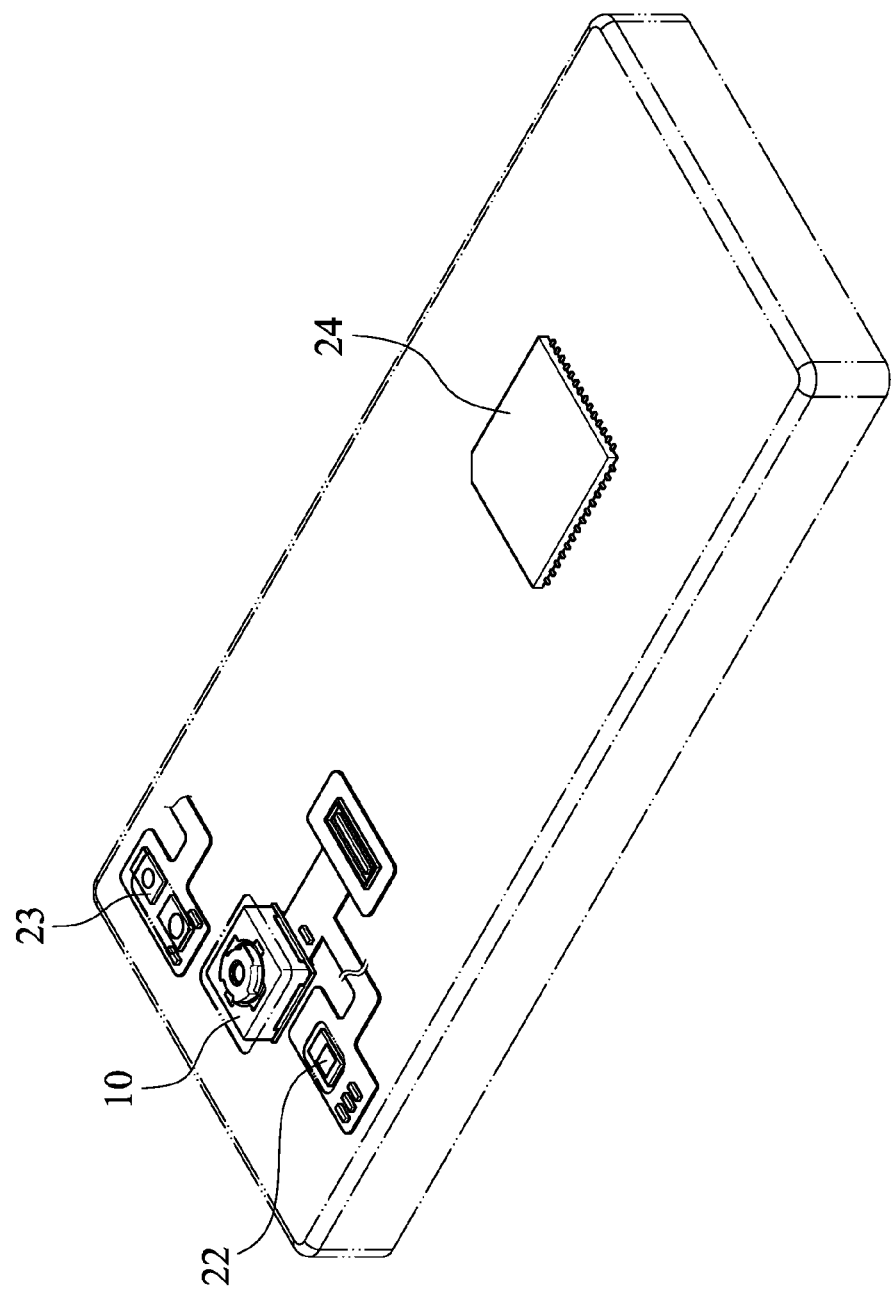
FIG. 16A is a perspective schematic view of an electronic apparatus according to the 11th example of the present disclosure.
Figure 16B:
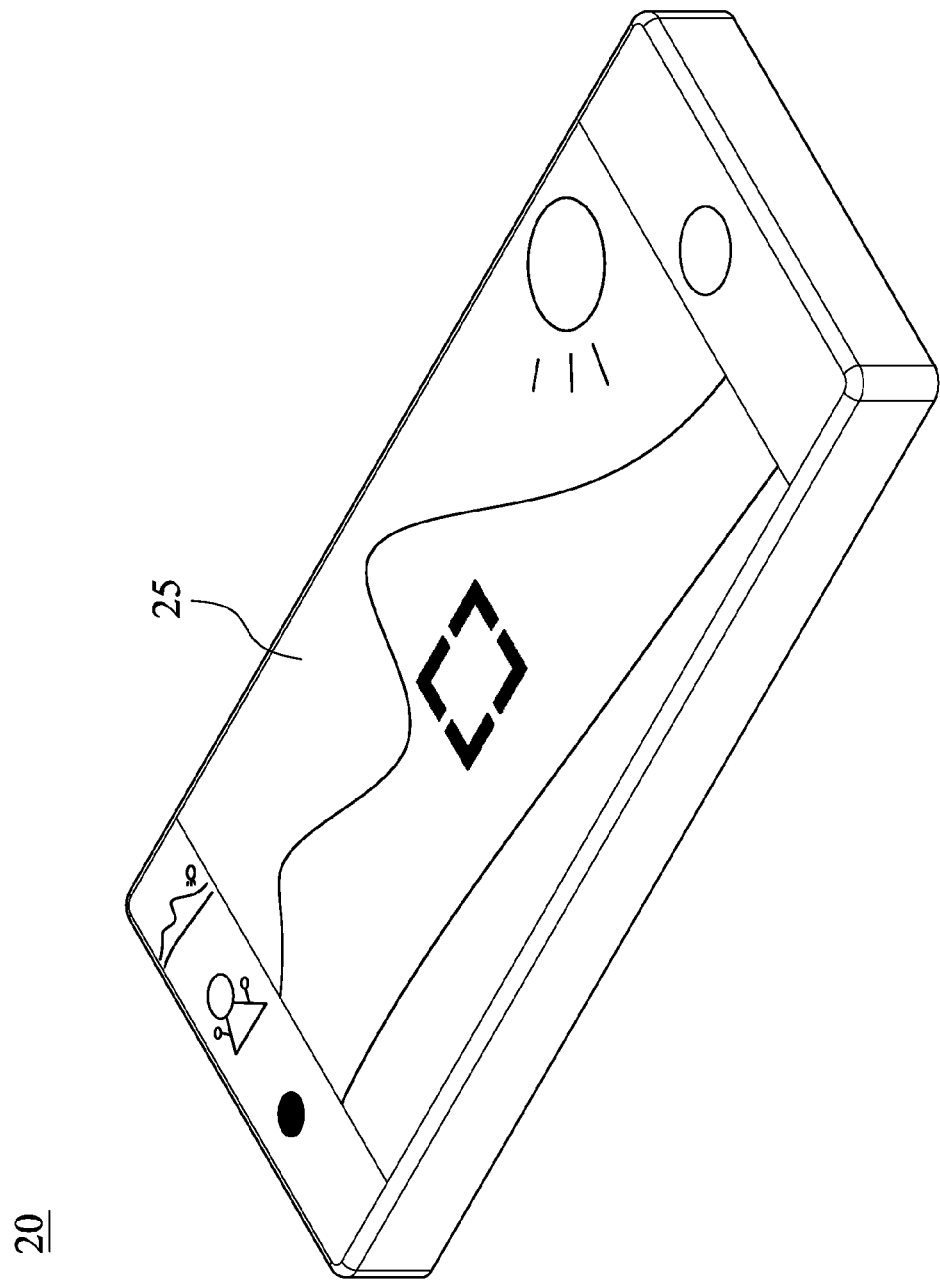
FIG. 16B is a schematic view of the electronic apparatus in FIG. 16A from another view angle.

FIG. 16A is a perspective schematic view of an electronic apparatus 20 according to the 11th example of the present disclosure. FIG. 16B is a schematic view of the electronic apparatus 20 in FIG. 16A from another view angle. The electronic apparatus 20 of the 11th example is a smart phone. The electronic apparatus 20 includes the image capturing device 10 of the 10th example, the flash module 22, the auxiliary focusing module 23, an image signal processor 24 and a user interface 25 (shown in FIG. 16B), wherein the image capturing device 10 is electrically connected with the flash module 22, the auxiliary focusing module 23, the image signal processor 24 and the user interface 25. When a user shoots with the electronic apparatus 20 via the user interface 25, lights are focused by the image capturing device 10 for generating an image, a light compensation function is provided by the flash module 22, the object distance of the imaged objected is provided by the auxiliary focusing module 23 for focusing quickly, and an optimizing image processing is provided by the image signal processor 24, so that the image quality can be further enhanced. The auxiliary focusing module 23 can adopt an infrared auxiliary focusing system or a laser auxiliary focusing system for focusing quickly. The user interface 25 can adopt a touch screen or a physical shooting button, and an image processing software can be coordinated with the user interface 25 for providing a variety of shooting modes and a variety of image processings.

12th Example

Figure 17:
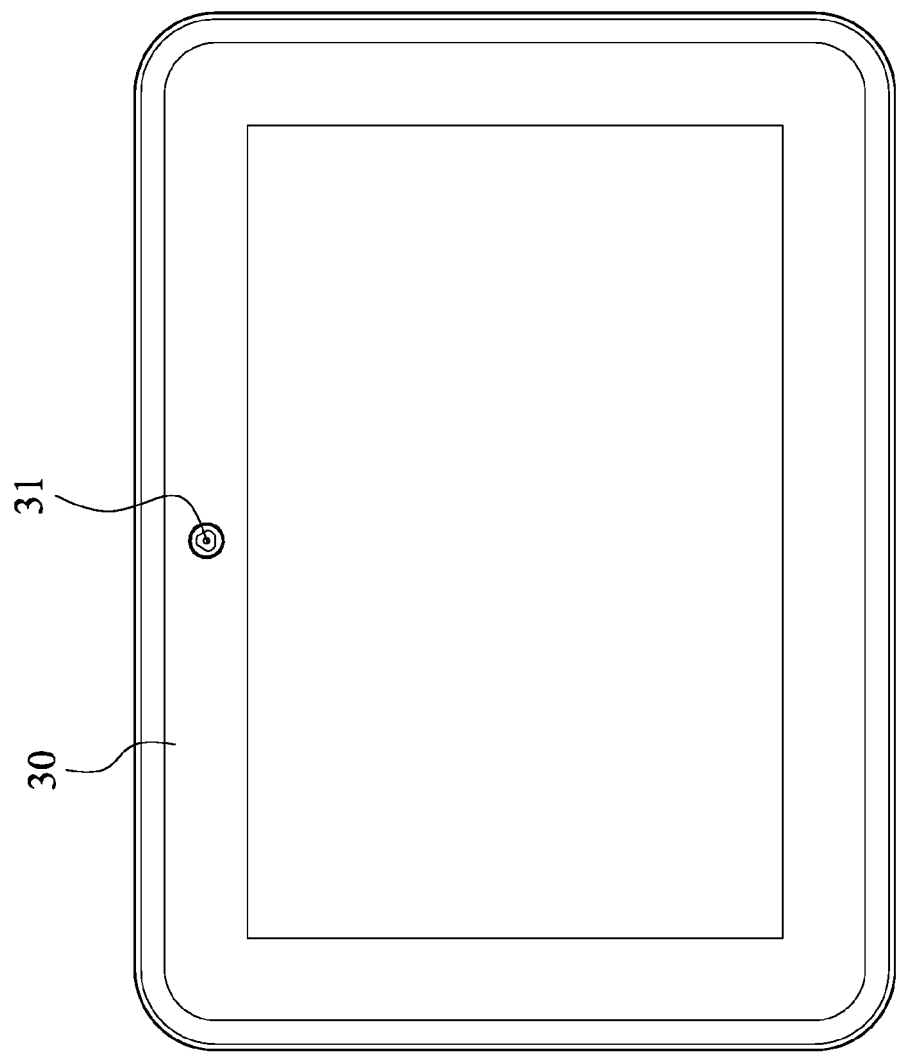
FIG. 17 is a schematic view of an electronic apparatus according to the 12th example of the present disclosure.

FIG. 17 is a schematic view of an electronic apparatus 30 according to the 12th example of the present disclosure. In FIG. 17, the electronic apparatus 30 of the 12th embodiment is a tablet personal computer. The electronic apparatus 30 includes an image capturing device 31. The image capturing device 31 can be the same as that of the 10th example, and will not be repeated herein.

13th Example

Figure 18:
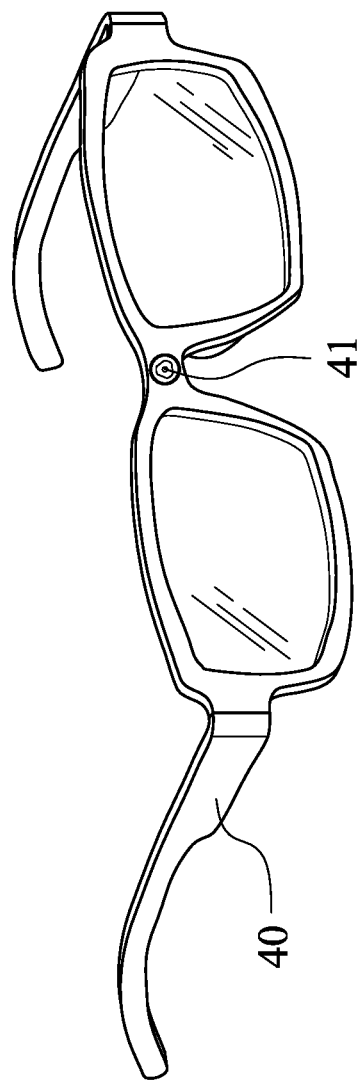
FIG. 18 is a schematic view of an electronic apparatus according to the 13th example of the present disclosure.

FIG. 18 is a schematic view of an electronic apparatus 40 according to the 13th example of the present disclosure. In FIG. 18, the electronic apparatus 40 of the 13th embodiment is a head-mounted display (HMD). The electronic apparatus 40 includes an image capturing device 41. The image capturing device 41 can be the same as that of the 10th example, and will not be repeated herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A light blocking sheet, comprising:
   a first outer layer comprising a first opening;
   a second outer layer comprising a second opening;
   an inner substrate layer disposed between the first outer layer and the second outer layer, wherein the inner substrate layer connects the first outer layer to the second outer layer, and the inner substrate layer comprises a substrate opening; and
   a central axis coaxial with the first opening, the second opening and the substrate opening;
   wherein a minimum diameter of the substrate opening is $\Phi smin$, a diameter of the first opening is $\Phi 1$, a diameter of the second opening is $\Phi 2$, and the following conditions are satisfied:

$2.0 \ \mu m < (\Phi smin - \Phi 1)/2 < 200 \ \mu m$; and $2.0 \ \mu m < (\Phi smin - \Phi 2)/2 < 200 \ \mu m$.

2. The light blocking sheet of claim 1, wherein the inner substrate layer is made of a plastic material, and each of the first outer layer and the second outer layer is made of a black carbon-containing material.

3. The light blocking sheet of claim 1, wherein the minimum diameter of the substrate opening is $\Phi smin$, the diameter of the first opening is $\Phi 1$, the diameter of the second opening is $\Phi 2$, and the following conditions are satisfied:

$3.0 \ \mu m < (\Phi smin - \Phi 1)/2 < 85 \ \mu m$; and $3.0 \ \mu m < (\Phi smin - \Phi 2)/2 < 85 \ \mu m$.

4. The light blocking sheet of claim 1, further comprising:
   an air layer located between the first outer layer and the second outer layer, wherein the air layer is close to the first opening and the second opening.

5. The light blocking sheet of claim 4, wherein a length parallel to the central axis of the air layer is d, and the following condition is satisfied:

$5 \ \mu m < d < 49 \ \mu m$.

6. The light blocking sheet of claim 4, wherein a thickness of the light blocking sheet is t, and the following condition is satisfied:

$5 \ \mu m < t < 49 \ \mu m$.

7. The light blocking sheet of claim 4, wherein a length parallel to the central axis of the air layer is d, a thickness of the light blocking sheet is t, and the following condition is satisfied:

$0.12 < d/t < 0.67$.

8. The light blocking sheet of claim 1, wherein the diameter of the first opening is $\Phi 1$, the diameter of the second opening is $\Phi 2$, and the following condition is satisfied:

$0.93 < \Phi 1/\Phi 2 < 1.07$.

9. The light blocking sheet of claim 1, wherein a maximum outer diameter of the light blocking sheet is $\Phi$, a thickness of the light blocking sheet is t, and the following condition is satisfied:

$1 < 1000 t/\Phi < 50$.

10. An imaging lens module, comprising:
    a barrel;
    an optical lens assembly disposed in the barrel; and
    the light blocking sheet of claim 1 disposed in the barrel.

11. The imaging lens module of claim 10, wherein the first outer layer of the light blocking sheet further comprises a first surface corresponding to an object-side surface of the imaging lens module, the second outer layer of the light blocking sheet further comprises a second surface corresponding to an image-side surface of the imaging lens module, and at least one of the first surface and the second surface comprises an anti-reflection film coated thereon.

12. The imaging lens module of claim 11, wherein the anti-reflection film comprises a silicon dioxide material layer.

13. The imaging lens module of claim 11, wherein only one of the first surface and the second surface comprises the anti-reflection film coated thereon.

14. An electronic apparatus, comprising:
    the imaging lens module of claim 10; and
    an image sensor disposed on an image surface of the imaging lens module.

15. A light blocking sheet, comprising:
    a first outer layer comprising a first opening;
    a second outer layer comprising a second opening;
    an inner substrate layer disposed between the first outer layer and the second outer layer, wherein the inner substrate layer connects the first outer layer to the second outer layer, and the inner substrate layer comprises a substrate opening;
    an air layer located between the first outer layer and the second outer layer, wherein the air layer is close to the first opening and the second opening; and
    a central axis coaxial with the first opening, the second opening and the substrate opening;
    wherein a length parallel to the central axis of the air layer is d, a minimum diameter of the substrate opening is $\Phi smin$, a diameter of the first opening is $\Phi 1$, a diameter of the second opening is $\Phi 2$, and the following conditions are satisfied:

$5 \ \mu m < d < 50 \ \mu m$;

$2.0 \ \mu m < (\Phi smin - \Phi 1)/2 < 200 \ \mu m$; and $2.0 \ \mu m < (\Phi smin - \Phi 2)/2 < 200 \ \mu m$.

16. The light blocking sheet of claim 15, wherein the inner substrate layer is made of a plastic material, and each of the first outer layer and the second outer layer is made of a black carbon-containing material.

17. The light blocking sheet of claim 16, wherein a thickness of each of the inner substrate layer, the first outer layer and the second outer layer is uniform.

18. The light blocking sheet of claim 16, wherein the minimum diameter of the substrate opening is $\Phi smin$, the diameter of the first opening is $\Phi 1$, the diameter of the second opening is $\Phi 2$, and the following conditions are satisfied:

$3.0 \ \mu m < (\Phi smin - \Phi 1)/2 < 85 \ \mu m$; and $3.0 \ \mu m < (\Phi smin - \Phi 2)/2 < 85 \ \mu m$.

19. The light blocking sheet of claim 16, wherein the length parallel to the central axis of the air layer is d, a thickness of the light blocking sheet is t, and the following condition is satisfied:

$0.12 < d/t < 0.67$.

20. An imaging lens module, comprising:
    a barrel;
    an optical lens assembly disposed in the barrel; and
    the light blocking sheet of claim 15 disposed in the barrel.

21. The imaging lens module of claim 20, wherein the first outer layer of the light blocking sheet further comprises a first surface corresponding to an object-side surface of the imaging lens module, the second outer layer of the light blocking sheet further comprises a second surface corresponding to an image-side surface of the imaging lens module, and at least one of the first surface and the second surface comprises an anti-reflection film coated thereon.

22. An electronic apparatus, comprising:
   the imaging lens module of claim 20, and
   an image sensor disposed on an image surface of the imaging lens module.

* * * * *